United States Patent
Oh

(10) Patent No.: US 9,252,348 B2
(45) Date of Patent: Feb. 2, 2016

(54) LIGHT EMITTING LAMP

(71) Applicant: LG Innotek Co., Ltd., Seoul (KR)

(72) Inventor: Nam Seok Oh, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 226 days.

(21) Appl. No.: 13/684,362

(22) Filed: Nov. 23, 2012

(65) Prior Publication Data

US 2013/0264538 A1 Oct. 10, 2013

(30) Foreign Application Priority Data

Apr. 9, 2012 (KR) .................. 10-2012-0036648

(51) Int. Cl.
| | |
|---|---|
| *H01L 33/62* | (2010.01) |
| *H01L 33/64* | (2010.01) |
| *H01L 27/15* | (2006.01) |
| *H01L 25/075* | (2006.01) |
| *H01L 33/48* | (2010.01) |

(52) U.S. Cl.
CPC ............... *H01L 33/64* (2013.01); *H01L 27/15* (2013.01); *H01L 33/647* (2013.01); *H01L 25/0753* (2013.01); *H01L 33/486* (2013.01); *H01L 33/62* (2013.01); *H01L 2224/45139* (2013.01); *H01L 2224/48247* (2013.01); *H01L 2224/48465* (2013.01); *H01L 2224/49113* (2013.01); *H01L 2924/3025* (2013.01)

(58) Field of Classification Search
CPC ..... H01L 33/48; H01L 33/483; H01L 33/486; H01L 33/62; H01L 33/647
See application file for complete search history.

(56) References Cited

U.S. PATENT DOCUMENTS

| | | | |
|---|---|---|---|
| 2005/0151231 A1 | 7/2005 | Yoshida | |
| 2008/0128724 A1 | 6/2008 | Isobe et al. | |
| 2008/0298081 A1* | 12/2008 | Oon et al. | 362/555 |
| 2009/0315068 A1 | 12/2009 | Oshio et al. | |
| 2010/0264450 A1* | 10/2010 | Norfidathul et al. | 257/99 |
| 2011/0044062 A1* | 2/2011 | Ng et al. | 362/382 |
| 2011/0051037 A1* | 3/2011 | Kim et al. | 349/62 |

(Continued)

FOREIGN PATENT DOCUMENTS

| | | |
|---|---|---|
| EP | 2 860 775 A1 | 4/2015 |
| KR | 2010-0003000 A | 1/2010 |

OTHER PUBLICATIONS

Definition of "between". Merriam-Webster.com. http://www.merriam-webster.com/dictionary/between. Retrieved on Jul. 27, 2015.*

(Continued)

*Primary Examiner* — Yu Chen
(74) *Attorney, Agent, or Firm* — Ked & Associates, LLP

(57) ABSTRACT

Disclosed is a light emitting lamp including a light source module including at least one light source and a light guide layer disposed on a substrate burying the at least one light source, and a housing accommodating the light source module, and the at least one light source includes a body having a cavity, a first lead frame including one end exposed to the cavity and the other end passing through the body and exposed to one surface of the body, a second lead frame including one end exposed to one portion of the surface of the body, the other end exposed to the another portion of the surface of the body, and an intermediate part exposed to the cavity, and at least one light emitting chip including a first semiconductor layer, an active layer and a second semiconductor layer, and disposed on the first lead frame.

33 Claims, 26 Drawing Sheets

(56) References Cited

U.S. PATENT DOCUMENTS

2011/0199787 A1\* 8/2011 Kim et al. .................... 362/612
2011/0284900 A1 11/2011 Kim

OTHER PUBLICATIONS

U.S. Office Action issued in co-pending U.S. Appl. No. 13/738,800 dated Apr. 10, 2014.
U.S. Office Action issued in co-pending U.S. Appl. No. 13/738,800 dated Aug. 22, 2014.
U.S. Office Action issued in co-pending U.S. Appl. No. 13/738,800 dated Dec. 26, 2014.
U.S. Notice of Allowance issued in co-pending U.S. Appl. No. 13/738,800 dated Jun. 30, 2015.
European Search Report dated Dec. 2, 2015 issued in Application No. 12186216.3.

\* cited by examiner

LIGHT EMITTING LAMP

CROSS-REFERENCE TO RELATED APPLICATION(S)

This application claims priority under 35 U.S.C. §119 to Korean Patent Application No 10-2012-0036648, filed in Korea on Apr. 9, 2012, which is hereby incorporated in its entirety by reference as if fully set forth herein.

BACKGROUND

1. Field

Embodiments relate to a lamp which emits light.

2. Background

Lamps refer to apparatuses which supply or adjust light for a specific purpose. As light sources of lamps, incandescent light bulbs, fluorescent lights and neon lights may be used, and recently, light emitting diodes (LEDs) are used.

The LEDs are devices which convert an electrical signal into ultraviolet light or visible light using characteristics of a compound semiconductor. The LEDs do not use harmful materials, such as mercury, differently from fluorescent lights, and thus cause minimal environmental contamination. Further, the lifespan of the LEDs is longer than those of incandescent light bulbs, fluorescent lights and neon lights. Further, as compared with incandescent light bulbs, fluorescent lights and neon lights, the LEDs have advantages, such as a low power consumption rate and excellent visibility and little glare due to a high color temperature.

Lamps using LEDs may be used in a backlight, a display device, an illumination light, an indicator lamp for vehicles, and a head lamp according to purposes thereof.

A lamp may include an LED package mounted on a substrate. The LED package may include a package body and light emitting chips disposed on the package body. The temperature of the light emitting chips is increased when the lamp emits light. Since characteristics (for example, brightness and wavelength) of the light emitting chips may be changed according to increase of the temperature, heat dissipation measures to suppress increase of the temperature of the light emitting chips are required.

The above references are incorporated by reference herein where appropriate for appropriate teachings of additional or alternative details, features and/or technical background.

SUMMARY

Embodiments provide a light emitting lamp which has a thin profile, improves a degree of freedom in product design and heat dissipation efficiency and suppresses wavelength shift and brightness reduction.

In one embodiment, a light emitting lamp includes a light source module including at least one light source disposed on a substrate and a light guide layer disposed on the substrate burying the at least one light source, and a housing accommodating the light source module, wherein the at least one light source includes a body having a cavity, a first lead frame including one end exposed to the cavity and the other end passing through the body and exposed to one surface of the body, a second lead frame including one end exposed to one portion of the surface of the body, the other end exposed to another portion of the surface of the body, and an intermediate part exposed to the cavity, and at least one light emitting chip including a first semiconductor layer, an active layer and a second semiconductor layer, and disposed on the first lead frame.

The first lead frame may include a first upper surface part which is exposed to the cavity and on which the at least one light emitting chip is disposed, and a first side surface part bent from a first side portion of the first upper surface part and exposed to the surface of the body.

The first lead frame may further include at least one through hole formed adjacent to a boundary part between the first upper surface part and the first side surface part.

The first lead frame may further include connection parts connecting the first upper surface part and the first side surface part, and the at least one through hole is located between the connection parts.

The length of a first connection part aligned with the at least one light emitting chip from among the connection parts may be greater than the length of a second connection part not aligned with the at least one light emitting chip, and the first direction may be the X-axis direction in an XYZ coordinate system.

The second lead frame may include a second upper surface part disposed around at least one side portion of the first upper surface part and exposed to the cavity of the body, and a second side surface part bent from the second upper surface part and exposed respectively to the one portion and the another portion of the surface of the body.

The light source module may further include a heat dissipation member disposed on the lower surface of the substrate. The at least one light source may be a side view type light emitting device package. The substrate may include at least one via hole. The light source module may be a surface light source.

The light source module may further include a reflective sheet disposed between the substrate and the light guide layer. The light source module may further include reflective patterns disposed on the reflective sheet. The light source module may further include a first optical sheet disposed on the light guide layer and dispersing light emitted from the light guide layer. The light source module may further include optical patterns disposed on the first optical sheet and blocking or reflecting light emitted from the at least one light source. The light source module may further include a second optical sheet disposed on the first optical sheet and the optical patterns. The light source module may further include a diffusion plate disposed on the second optical sheet.

The light guide layer may be formed of a UV curable resin including an oligomer. The UV curable resin may include at least one selected from among the group consisting of urethane acrylate, epoxy acrylate, polyester acrylate, polyether acrylate, polybutadiene acrylate and silicon acrylate.

The light guide layer may be formed of a thermosetting resin including at least one selected from among the group consisting of a polyester polyol resin, an acryl polyol resin, a hydrocarbon-based solvent and/or an ester-based solvent.

The light guide layer may include a diffusion material diffusing light including at least one selected from the group consisting of silicon, silica, glass bubbles, PMMA, urethane, Zn, Zr, Al2O3 and acryl.

The light source module may further include at least one connector disposed on the substrate to be electrically connected to the outside. The substrate may include a coupling fixing part to be coupled with the outside. The light emitting lamp may further include a plurality of lenses disposed on the diffusion plate. The substrate may include a circuit pattern and an insulating layer, and have flexibility.

The at least one light emitting chip may emit red light having a wavelength range of 600 nm~690 nm

BRIEF DESCRIPTION OF THE DRAWINGS

The embodiments will be described in detail with reference to the following drawings in which like reference numerals refer to like elements wherein.

Arrangements and embodiments may be described in detail with reference to the following drawings in which like reference numerals refer to like elements and wherein.

DETAILED DESCRIPTION

Figure 1:
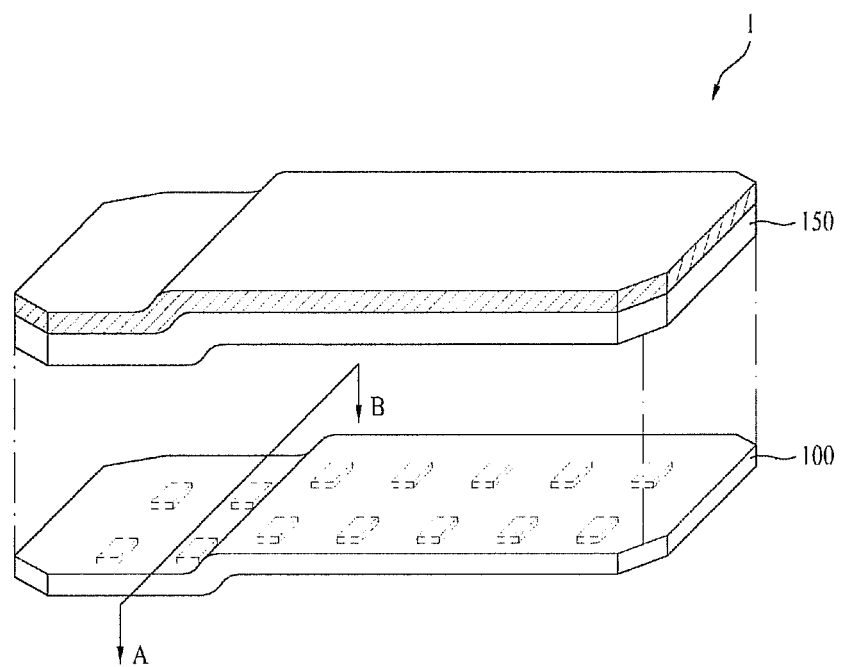
FIG. 1 is a perspective view illustrating a light emitting lamp in accordance with one embodiment.

Hereinafter, embodiments will be described with reference to the annexed drawings.

It will be understood that when an element is referred to as being "on" or "under" another element, it can be directly on/under the element, and one or more intervening elements may also be present. When an element is referred to as being "on" or "under", "under the element" as well as "on the element" can be included based on the element.

In the drawings, the thicknesses or sizes of respective layers are exaggerated, omitted, or schematically illustrated for convenience and clarity of description. Further, the sizes of the respective elements do not denote the actual sizes thereof. Hereinafter, a light emitting lamp in accordance with one embodiment will be described with reference to the annexed drawings.

FIG. 1 is a perspective view illustrating a light emitting lamp 1 in accordance with one embodiment.

With reference to FIG. 1, the light emitting lamp 1 includes a light source module 100 which is a surface light source, and a housing 150 to accommodate the light source module 100.

The light source module 100 includes at least one light emitting device 20 which emits light, diffuses and disperses point light emitted from the light emitting device 20 to produce surface light, and has flexibility and may thus be bent.

The housing 150 protects the light source module 100 from impact, and may be formed of a material (for example, acryl) which transmits light irradiated from the light source module 100. Further, the housing 150 may include a bent part, and the light source module 100 having flexibility may be easily accommodated in the bent housing 150.

Figure 2:
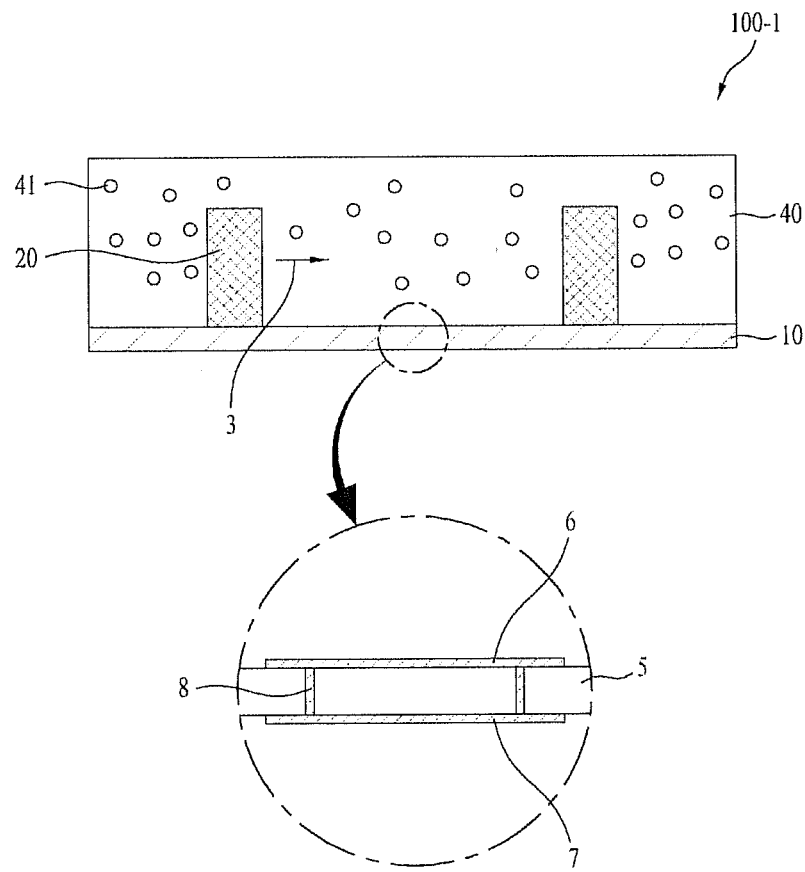
FIGS. 2 to 20 are cross-sectional views illustrating light source modules shown in FIG. 1 in accordance with first to nineteenth embodiments.

FIG. 2 illustrates a light source module 100-1 shown in FIG. 1 in accordance with a first embodiment.

FIG. 2 is a cross-sectional view taken along the line A-B of FIG. 1. With reference to FIG. 2, the light source module 100-1 includes a flexible printed circuit board 10, light emitting devices 20 and a light guide layer 40.

The flexible printed circuit board 10 may be a printed circuit board formed of an insulating material having flexibility. For example, the flexible printed circuit board 10 may include a base member (for example, 5) and circuit patterns (for example, 6 and 7) disposed on at least one surface of the base member (for example, 5). The base member (for example, 5) may be a film having flexibility and insulating properties, for example, polyimide or epoxy (for example, FR-4).

The flexible printed circuit board 10 may include the insulating film 5 (for example, polyimide or RF-4), a first copper foil pattern 6, a second copper foil pattern 7, and via contacts 8. The first copper foil pattern 6 is formed on one surface (for example, the upper surface) of the insulating film 5, the second copper foil pattern 7 is formed on the other surface (for example, the lower surface) of the insulating film 5, and the via contacts 8 may pass through the insulating film 5 and connect the first copper foil pattern 6 and the second copper foil pattern 7.

One or more light emitting devices 20 are disposed on the flexible printed circuit board 10, and emit light. For example, the light emitting devices 20 may be side view type light emitting device packages which are disposed so that emitted light proceeds in a sideward direction 3 of the light guide layer 40. Here, a light emitting chip mounted on the light emitting device package may be a vertical type light emitting chip, for example, a red light emitting chip shown in FIG. 47, but the disclosure is not limited thereto.

The light guide layer 40 may be disposed on the flexible printed circuit board 10 and the light emitting devices 20 so as to bury the light emitting devices 20, and diffuse and induce light, emitted from the light emitting devices 20 in the sideward direction 3 of the light guide layer 40, in a direction toward one surface (for example, the upper surface) of the light guide layer 40.

The light guide layer 40 may be formed of a resin of a material which may diffuse light. For example, the light guide layer 40 may be formed of a highly thermally resistant UV curable resin including an oligomer. Here, the oligomer may have a content of 40 to 50 parts by weight. Further, the UV curable resin may use urethane acrylate, but the disclosure is not limited thereto. That is, in addition to urethane acrylate, the UV curable resin may use at least one material from among epoxy acrylate, polyester acrylate, polyether acrylate, polybutadiene acrylate and silicon acrylate.

Particularly, if urethane acrylate is used as the oligomer, two types of urethane acrylate may be mixed so as to simultaneously achieve different physical properties.

For example, isocyanate is used during a process of compounding urethane acrylate, and physical properties (yellow coloring property, weather resistance, chemical resistance, etc.) of urethane acrylate may be determined by isocyanate. Here, as one kind of urethane acrylate, urethane acrylate type-isocyanate in which NCO of isophorone diisocyanate (IPD) or isophorone diisocyanate (IPDI) has a content of 37% (hereinafter, referred to as 'a first oligomer') is used, and as the other kind of urethane acrylate, urethane acrylate type-isocyanate in which NCO of isophorone diisocyanate (PDI) or isophorone diisocyanate (IPDI) has a content of 30~50% or 25~35% (hereinafter, referred to as 'a second oligomer'), thereby forming the oligomer forming the light guide layer 40 in accordance with the embodiment. That is, the first oligomer and the second oligomer having different physical properties may be obtained by adjusting the content of NCO, and may be mixed to form the oligomer forming the light guide layer 40. Here, the weight rate of the first oligomer may be in the range of 15 to 20, and the weight rate of the second oligomer may be in the rage of 25 to 35.

The light guide layer 40 may further include at least one of a monomer and a photo initiator. Here, the monomer may have a content of 65 to 90 parts by weight, and in more detail, the monomer may be formed of a mixture including isobornyl acrylate (IBOA) of 35~45 parts by weight, 2-hydroxyethyl methacrylate (2-HEMA) of 10~15 parts by weight and 2-hydroxybutyl acrylate (2-HBA) of 15~20 parts by weight. Further, the photo initiator (for example, 1-hydroxycyclohexyl phenyl-ketone, diphenyl, diphenyl (2,4,6-trimethylbezoyl phosphine oxide, etc) may have a content of 0.5~1 parts by weight.

Further, the light guide layer 40 may be formed of a highly thermally resistant thermosetting resin. In more detail, the light guide layer 40 may be formed of a thermosetting resin including at least one of a polyester polyol resin, an acryl polyol resin, a hydrocarbon-based solvent and/or an ester-based solvent. Such a thermosetting resin may include a thermal hardener to improve film strength.

The polyester polyol resin may have a content of 9~30% with respect to the overall weight of the thermosetting resin. Further, the acryl polyol resin may have a content of 20~40% with respect to the overall weight of the thermosetting rein.

The hydrocarbon-based solvent and/or the ester-based solvent may have a content of 30~70% with respect to the overall weight of the thermosetting rein. The thermal hardener may have a content of 1~10% with respect to the overall weight of the thermosetting rein.

If the light guide layer 40 is formed of the above-described material, the light guide layer 40 has reinforced thermal resistance, and even if the light source module 100-1 is used in a light emitting lamp emitting heat of a high temperature, lowering of brightness due to heat may be minimized and thus a light emitting lamp having high reliability may be provided.

Further, the light source module 100-1 in accordance with this embodiment uses the above-described material to achieve a surface light source, and may thus greatly reduce the thickness of the light guide layer 40 and achieve a thin profile of the entirety of a product. Further, the light source module 100-1 in accordance with this embodiment is flexible, and may thus be easily applied to a bent surface, improve a degree of freedom in design and be applied to other flexible displays.

The light guide layer 40 may include a diffusion material 41 provided with apertures (or holes), and the diffusion material 41 may be mixed with or diffused in the resin forming the light guide layer 40 and serve to improve reflecting and diffusing properties of light.

For example, light emitted from the light emitting devices 20 to the inside of the light guide layer 40 is reflected and transmitted by the apertures of the diffusion material 41 and is diffused and collected in the light guide layer 40, and the diffused and collected light may be emitted through one surface (for example, the upper surface) of the light guide layer 40. Here, the diffusion material 41 increases reflectivity and diffusivity of light and improves the amount and uniformity of light emitted through an upper surface of the light guide layer 40, consequently improving brightness of the light source module 100-1.

The content of the diffusion material 41 may be properly adjusted so as to obtain light diffusion effects. In more detail, the content of the diffusion material 41 may be adjusted in the range of 0.01~0.3% with respect to the overall weight of the light guide layer 40, but the disclosure is not limited thereto. The diffusion material 41 may include one selected from the group consisting of silicon, silica, glass bubbles, PMMA, urethane, Zn, Zr, Al2O3 and acryl, and may have a particle diameter of 1~20 μm but the disclosure is not limited thereto.

In accordance with the first embodiment, the light source module 100-1 may have a thin profile due to flexibility of the flexible printed circuit board 10 and the light guide layer 40, and may be easily mounted on a bent housing, thus improving a degree of freedom in product design.

Figure 3:
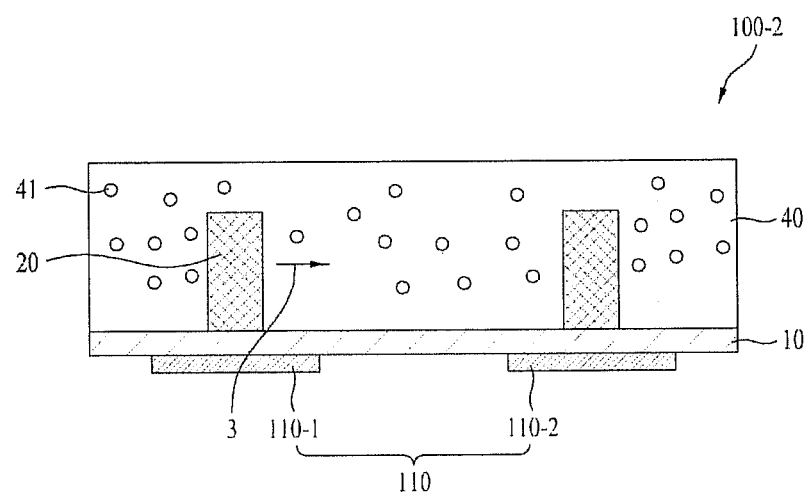

FIG. 3 illustrates a light source module 100-2 shown in FIG. 1 in accordance with a second embodiment. Some parts in this embodiment which are substantially the same as those in the first embodiment shown in FIG. 2 are denoted by the same reference numerals even though they are depicted in different drawings, and redundant description of parts in the above-mentioned description will be omitted or briefly given.

With reference to FIG. 3, the light source module 100-2 in accordance with the second embodiment may further include a heat dissipation member 110 in addition to the light source module 100-1 in accordance with the first embodiment so as to improve heat dissipation efficiency.

The heat dissipation member 110 is disposed on the lower surface of the flexible printed circuit board 10, and serves to dissipate heat generated from the light emitting devices 20 to the outside. That is, the heat dissipation member 110 may improve efficiency of dissipating heat generated from the light emitting devices 20 which are light sources, to the outside.

For example, the heat dissipation member 110 may be disposed at parts on the lower surface of the flexible printed circuit board 10. The heat dissipation member 110 may include a plurality of heat dissipation layers (for example, 110-1 and 110-2). In order to improve heat dissipation effects, the heat dissipation layers 110-1 and 110-2 may partially overlap with the light emitting devices 20 in the vertical direction. Here, the vertical direction may be a direction from the flexible printed circuit board 10 to the light guide layer 40.

The heat dissipation member 110 may be formed of a material having high thermal conductivity, for example, aluminum, an aluminum alloy, copper or a copper alloy. Further, the heat dissipation member 110 may be a metal core printed circuit board (MCPCB). The heat dissipation member 110 may be attached to the lower surface of the flexible printed circuit board 10 by an acryl-based adhesive (not shown).

In general, if the temperature of light emitting devices is increased by heat generated from the light emitting devices, brightness of the light emitting devices may be reduced and shift of the wavelength of the generated heat may occur. Particularly, if the light emitting devices are red light emitting diodes (LEDs), wavelength shift and brightness reduction are severe.

However, the light source module 100-2 includes the heat dissipation member 110 on the lower surface of the flexible printed circuit 10 to effectively dissipate heat generated from the light emitting devices 20, thereby suppressing increase of the temperature of the light emitting devices 20 and thus suppressing reduction of brightness and generation of wavelength shift.

Figure 4:
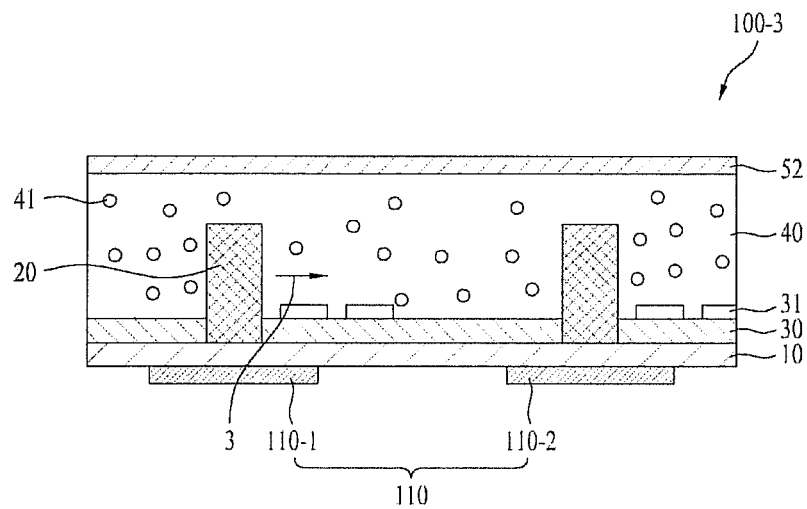

FIG. 4 illustrates a light source module 100-3 shown in FIG. 1 in accordance with a third embodiment. Some parts in this embodiment which are substantially the same as those in the second embodiment shown in FIG. 3 are denoted by the same reference numerals even though they are depicted in different drawings, and redundant description of parts in the above-mentioned description will be omitted or briefly given.

With reference to FIG. 4, the light source module 100-3 in accordance with the third embodiment may further include a reflective sheet 30, reflective patterns 31 and a first optical sheet 52 in addition to the light source module 100-2 in accordance with the second embodiment.

The reflective sheet 30 is disposed between the flexible printed circuit board 10 and the light guide layer 40, and may have a structure through which the light emitting devices 20 pass. For example, the reflective sheet 30 may be located at regions of the flexible printed circuit board 10 except for regions where the light emitting devices 20 are located.

The reflective sheet 30 may be formed of a material having high reflection efficiency. The reflective sheet 30 reflects light irradiated from the light emitting devices 20 to one surface (for example, the upper surface) of the light guide layer 40 and prevents the light from leaking to the other surface (for example, the lower surface) of the light guide layer 40, thereby reducing optical loss. Such a reflective sheet 30 may be formed in a film type, and may include a synthetic resin containing a white pigment which is diffused in the resin in order to implement acceleration of light reflection and diffusion.

For example, titanium oxide, aluminum oxide, zinc oxide, lead carbonate, barium sulfate or calcium carbonate may be used as the white pigment, and polyethylene terephthalate, polyethylene naphtalate, an acrylic resin, polycarbonate, polystyrene, polyolefin, cellulose acetate or weather resistant vinyl chloride may be used as the synthetic resin, but the disclosure is not limited thereto.

The reflective patterns 31 are disposed on the surface of the reflective sheet 30, and may serve to scatter and disperse incident light. The reflective patterns 31 may be formed by printing the surface of the reflective sheet 30 with reflective ink including one of $TiO_2$, $CaCO_3$, $BaSO_4$, $Al_2O_3$, silicon and polystyrene (PS), but the disclosure is not limited thereto.

Further, the reflective patterns 31 may be plural regular or irregular protruding patterns. In order to increase light scattering effects, the reflective patterns 31 may have a prism shape, a lenticular shape, a lens shape or a combinational shape thereof, but the disclosure is not limited thereto. Further, in FIG. 4, the cross-section of the reflective patterns 31 may have various shapes, i.e., a polygonal shape, such as a triangular shape or a rectangular shape, a semicircular shape, a sine wave shape, etc., and the plane of the reflective patterns 31 seen from the top may have a polygonal shape (for example, a hexagonal shape), a circular shape, an oval shape or a semicircular shape.

Figure 21:
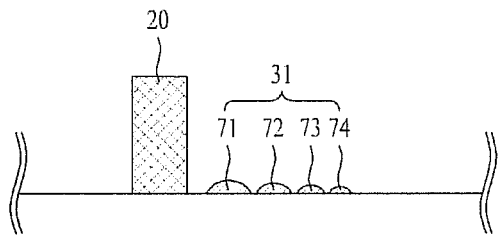
FIG. 21 is a view illustrating reflective patterns shown in FIG. 4 in accordance with one embodiment.

FIG. 21 is a view illustrating the reflective patterns shown in FIG. 4 in accordance with one embodiment. With reference to FIG. 21, the reflective patterns 31 may have different diameters according to separation distances from the light emitting device 20.

For example, as the reflective patterns 31 are closer to the light emitting device 20, the diameters of the reflective patterns 31 are greater. In more detail, the diameters of the reflective patterns 31 may decrease in order of a first reflective pattern 71, a second reflective pattern 72, a third reflective pattern 73 and a fourth reflective pattern 74. However, the disclosure is not limited thereto.

The first optical sheet 52 is disposed on the light guide layer 40, and transmits light emitted from one surface (for example, the upper surface) of the light guide layer 40. The first optical sheet 52 may be formed of a material having high light transmissivity, for example, polyethylene terephthalate (PET).

Figure 5:
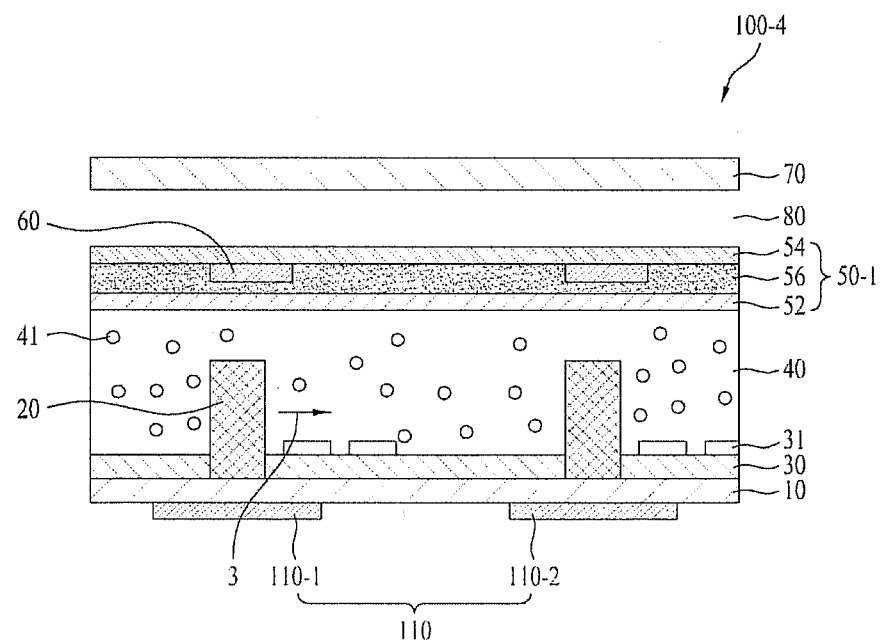

FIG. 5 illustrates a light source module 100-4 shown in FIG. 1 in accordance with a fourth embodiment.

With reference to FIG. 5, the light source module 100-4 in accordance with the fourth embodiment may further include an adhesive member 56, light shielding patterns 60, a second optical sheet 54 and a diffusion plate 70.

The second optical sheet 54 is disposed on the first optical sheet 52. The second optical sheet 54 may be formed of a material having high light transmissivity, for example, PET.

The adhesive member 56 is disposed between the first optical sheet 52 and the second optical sheet 54, and adheres the first optical sheet 52 and the second optical sheet 54 to each other.

The optical patterns 60 may be disposed on at least one of the upper surface of the first optical sheet 52 and the lower surface of the second optical sheet 54. The optical patterns 60 may be disposed on at least one of the upper surface of the first optical sheet 52 and the lower surface of the second optical sheet 54 by the adhesive member 56. In accordance with another embodiment, the light source module 100-4 may further include one or more optical sheets (not shown) on the second optical sheet 56. Here, a structure including the first optical sheet 52, the second optical sheet 54, the adhesive member 56 and the optical patterns 60 may be defined as an optical pattern layer 50-1.

The optical patterns 60 may be light shielding patterns to prevent light emitted from the light emitting devices 20 from being concentrated. The optical patterns 60 may be aligned with the light emitting devices 20, and may be adhered to the first optical sheet 52 and the second optical sheet 54 by the adhesive member 56.

The first optical sheet 52 and the second optical sheet 54 may be formed of a material having high light transmissivity, for example, PET.

The optical patterns 60 basically function to prevent light emitted from the light emitting devices 20 from being concentrated. That is, the optical patterns 60 together with the above-described reflective patterns 31 may achieve uniform surface light emission.

The optical patterns 60 may be light shielding patterns to shield a part of light emitted from the light emitting devices 20, and may prevent deterioration of optical characteristics or exposure of yellowish light due to an excessively high light intensity. For example, the optical patterns 60 may serve to prevent light from being concentrated on regions adjacent to the light emitting devices 20 and to disperse light.

The optical patterns 60 may be formed by performing a printing process on the upper surface of the first optical sheet 52 or the lower surface of the second optical sheet 54 using light shielding ink. The density and/or size of the optical patterns 60 may be controlled to perform a function of partially shielding light and a function of dispersing light, other than to perform a function of completely shielding light, thereby adjusting a light shielding degree or a light dispersing degree. For example, in order to improve light efficiency, the optical patterns 60 may be controlled such that the density of the optical patterns 60 is more decreased as the optical patterns 60 is more distant from the light emitting devices 20, but the disclosure is not limited thereto.

In more detail, the optical patterns 60 may be implemented as an overlapping print structure of combinational patterns. The overlapping print structure is a structure which is implemented by forming one pattern and printing another pattern thereon.

For example, the optical patterns 60 may have a structure in which a diffusion pattern and a light shielding pattern overlap. For example, the diffusion pattern may be formed on the lower surface of a polymer film (for example, the second optical sheet 54) in a light emitting direction using light shielding ink including one or more materials selected from the group consisting of $TiO_2$, $CaCO_3$, $BaSO_4$, $Al_2O_3$ and silicon. Further, the light shielding pattern may be formed on the polymer film using light shielding ink including Al or a mixture of Al and $TiO_2$.

That is, the diffusion pattern may be formed on the surface of the polymer film through white printing and then the light shielding pattern may be formed thereon or vice versa may be possible so as to form a double structure. Of course, it may be understood that the design of these patterns may be variously modified in consideration of light efficiency, a light intensity and a light shielding rate.

Otherwise, in accordance with another embodiment, the optical patterns 60 may have a triple structure including a first diffusion pattern, a second diffusion pattern and a light shielding pattern disposed therebetween. In such a triple structure, the above-described materials may be selected. For example, the first diffusion pattern may include $TiO_2$ having a high refractive index, the second diffusion pattern may include both $CaCO_3$ and $TiO_2$ having excellent light stability and color sense, and the light shielding pattern may include Al having a high concealing function. This embodiment may obtain light efficiency and uniformity through the optical patterns having such a triple structure. Particularly, $CaCO_3$ exerts a function of reducing exposure of yellowish light to finally produce white light and thus to more stably produce light, and in addition to $CaCO_3$, inorganic materials having a large particle size and a similar structure, such as $BaSO_4$, $Al_2O_3$ and silicon, may be used as a diffusion material employed by the diffusion pattern.

The adhesive member 56 may surround the optical patterns 60, and may fix the optical patterns 60 to the first optical sheet 52 and/or the second optical sheet 54. Here, the adhesive member 56 may use thermosetting PSA, a thermosetting adhesive, or a UV curable PSA type material, but the disclosure is not limited thereto.

The diffusion plate 70 is disposed on the light guide layer 40. The diffusion plate 70 may be disposed on the optical pattern layer 50-1, and may serve to uniformly diffuse light emitted via the light guide layer 40 throughout the overall surface of the diffusion plate 70. The diffusion plate 70 may be generally formed of acrylic resin, but the disclosure is not limited thereto. That is, in addition to acrylic resin, the diffusion plate 70 may be formed of a material performing a light diffusion function, i.e., highly permeable plastic, such as polystyrene (PS), polymethylmethacrylate (PMMA), cyclic olefin copolymer (COC), polyethylene terephthalate (PET) and resin.

An air gap 80 may be formed between the diffusion plate 70 and the light guide layer 40. The air gap 80 may increase uniformity of light supplied to the diffusion plate 70, and consequently increase uniformity of light diffused and emitted via the diffusion plate 70. Here, in order to minimize deviation of light transmitted by the light guide layer 40, the thickness of the first air gap 80 may be in the range of exceeding 0 mm and less than 20 mm but the disclosure is not limited thereto. That is, the thickness of the first air gap 80 may be changed as needed. Although not shown in the drawings, in accordance with another embodiment, one or more optical sheets may be disposed on the optical pattern layer 50-1.

Figure 6:
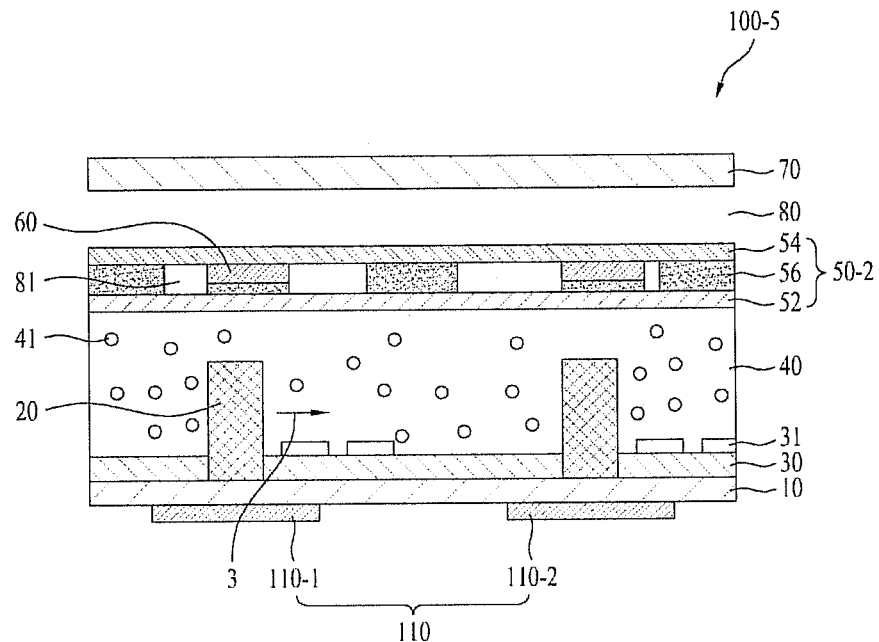

FIG. 6 illustrates a light source module 100-5 shown in FIG. 1 in accordance with a fifth embodiment.

With reference to FIG. 6, the light source module 100-5 in accordance with the fifth embodiment may further include a second air gap 81 in addition to the light source module 100-4 in accordance with the fourth embodiment. That is, the light source module 100-5 in accordance with the fifth embodiment may include the second air gap 81 between the first optical sheet 52 and the second optical sheet 54.

For example, the second air gap 81 may be formed on the adhesive member 56. Separated spaces (the second air gap 81) are formed around the optical patterns 60 of the adhesive member 56, and an adhesive material is applied to the remaining regions to adhere the first optical sheet 52 and the second optical sheet 54 to each other.

The adhesive member 56 may have a structure in which the second air gap 81 is located around the peripheries of the optical patterns 60. Otherwise, the adhesive member 56 may have a structure in which the adhesive member 56 surrounds the peripheries of the optical patterns 60 and the second air gap 81 is located around regions except for the peripheries of the optical patterns 60. The adhesive structure of the first optical sheet 52 and the second optical sheet 54 may also have a function of fixing the printed optical patterns 60. A structure including the first optical sheet 52, the second optical sheet 54, the second air gap 82, the adhesive member 56 and the optical patterns 60 may be defined as an optical pattern layer 50-2.

Since the second air gap 81 and the adhesive member 56 have different refractive indexes, the second air gap 81 may improve diffusion and dispersion of light traveling in a direction from the first optical sheet 52 to the second optical sheet 54. Thereby, the light source module 100-5 in accordance with the fifth embodiment may implement uniform surface light emission.

Figure 7:
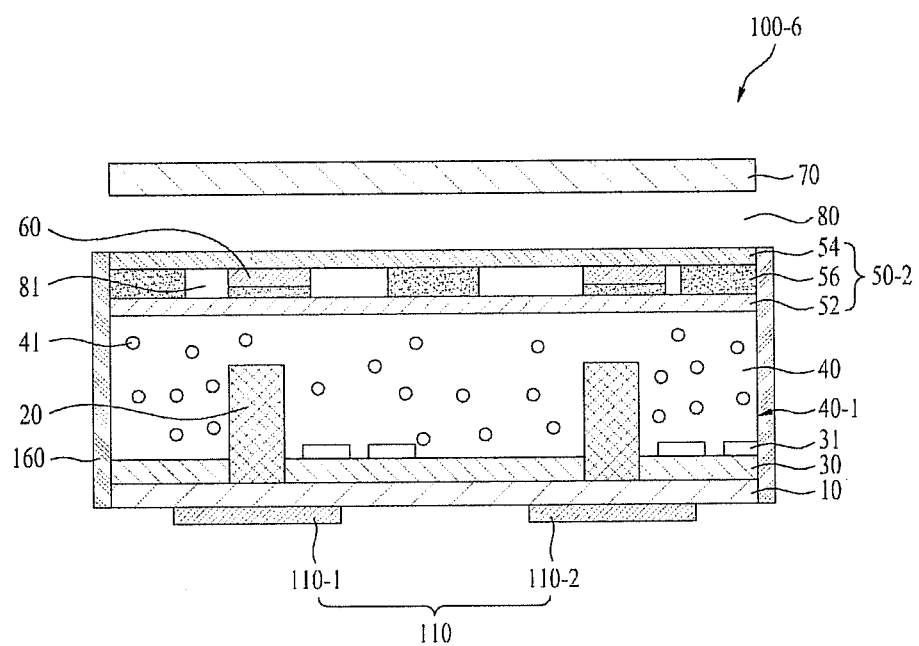

FIG. 7 illustrates a light source module 100-6 shown in FIG. 1 in accordance with a sixth embodiment.

With reference to FIG. 7, the light source module 100-6 in accordance with the sixth embodiment may further include a light reflective member 160 in addition to the light source module 100-5 in accordance with the fifth embodiment. The light reflective member 160 may be disposed at a part or the entirety of a side surface 40-1 of the light guide layer 40, and serve as a guide to prevent light emitted from the light emitting devices 20 from being discharged to the outside through the side surface 40-1 of the light guide layer 40.

The light reflective member 160 may be formed of a material having high light reflectivity, for example a white resist. Further, the light reflective member 160 may be formed of synthetic resin containing a white pigment which is diffused in the resin or synthetic resin containing metal particles having excellent light reflecting characteristics. Here, titanium oxide, aluminum oxide, zinc oxide, lead carbonate, barium sulfate or calcium carbonate may be used as the white pigment. If the light reflective member 160 includes metal powder, Ag powder having excellent reflectivity may be used. Further, the light reflective member 160 may further include a fluorescent whitening agent.

The light reflective member 160 may be directly connected to the side surface 40-1 of the light guide layer 40 through molding, or may be adhered to the side surface 40-1 of the light guide layer 40 via a separate adhesive material (or an adhesive tape).

The light source module 100-6 in accordance with the sixth embodiment may prevent light from leaking to the side surface 40-1 of the light guide layer 40 and thus reduce optical loss and increase light efficiency, and may improve brightness and luminous intensity at the same power. Although not shown in the drawings, a light source module in accordance with another embodiment may further include the light reflective member 160 on the side surface 40-1 of the light guide layer 40 in addition to one of the light source modules 100-1 to 100-4 in accordance with the first to fourth embodiments.

Figure 8:
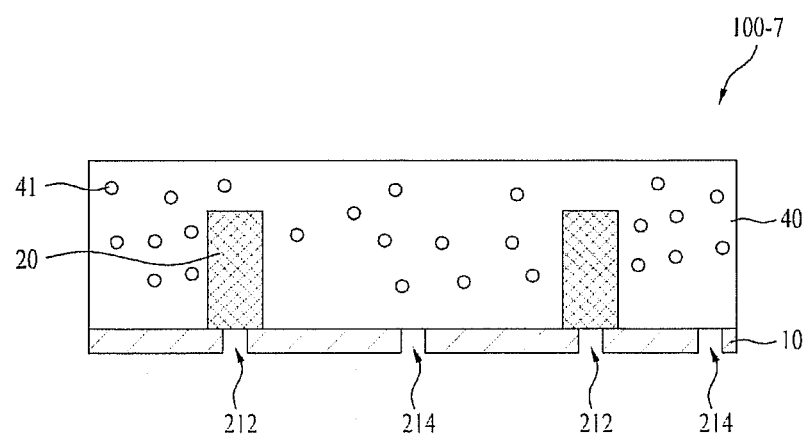

FIG. 8 illustrates a light source module 100-7 shown in FIG. 1 in accordance with a seventh embodiment. With reference to FIG. 8, the light source module 100-7 in accordance with the seventh embodiment may further include via holes 212 and 214 to improve heat dissipation which are provided on the flexible printed circuit board 10 in accordance with the first embodiment.

The via holes 212 and 214 may pass through the flexible printed circuit board 10, and exposure parts of the light emitting devices 20 or parts of the light guide layer 40. For example, the via holes 212 and 214 may include first via holes 212 exposing parts of the light emitting devices 20, and second via holes 214 exposing parts of the lower surface of the light guide layer 40.

Heat generated from heat sources, i.e., the light emitting devices 20, may be discharged directly to the outside through the first via holes 212, and heat conducted from the light emitting devices 20 to the light guide layer 40 may be discharged directly to the outside through the second via holes 214. The light source module 100-7 in accordance with the seventh embodiment discharges heat generated from the light emitting devices 20 to the outside through the via holes 212 and 214, thus improving heat dissipation efficiency. The first via holes 212 and the second via holes 214 may have various shapes, such as a polygonal shape, a circular shape, an oval shape, etc.

Figure 9:
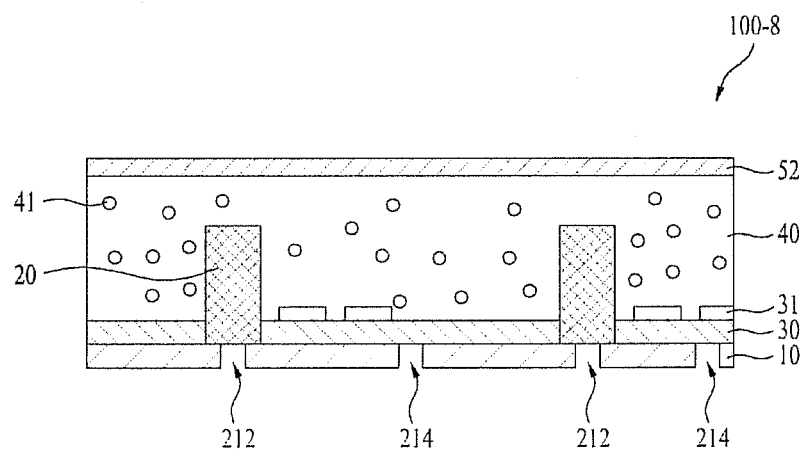

FIG. 9 illustrates a light source module 100-8 shown in FIG. 1 in accordance with an eighth embodiment. With reference to FIG. 9, the light source module 100-8 in accordance with the eighth embodiment may further include a reflective sheet 30, reflective patterns 31 and a first optical sheet 52 in addition to the light source module 100-7 in accordance with the seventh embodiment. The light source module 100-8 in accordance with the eighth embodiment may improve heat dissipation efficiency by means of the first and second via holes 212 and 214. Further, the added elements 30, 31 and 52 may be the same as those described with reference to FIG. 4.

Figure 10:
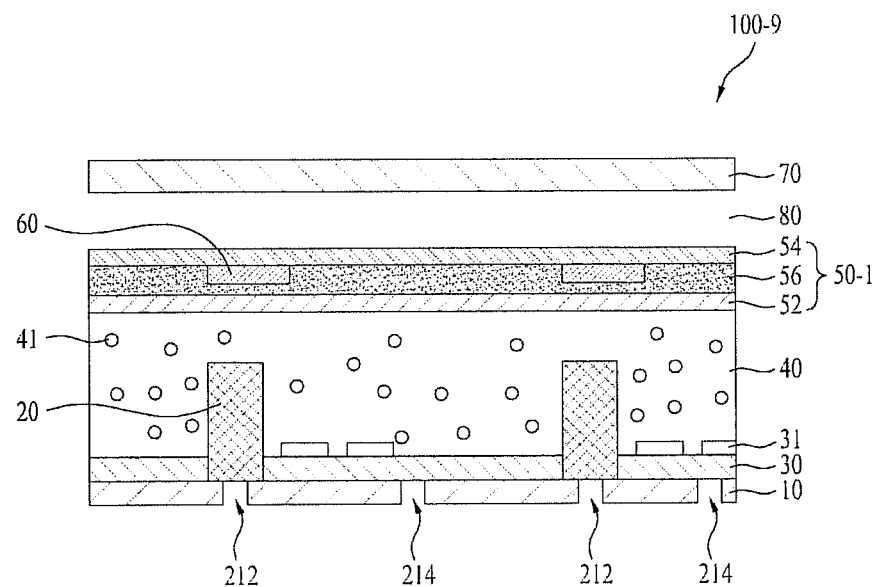

FIG. 10 illustrates a light source module 100-9 shown in FIG. 1 in accordance with a ninth embodiment. With reference to FIG. 10, the light source module 100-9 in accordance with the ninth embodiment may further include an adhesive member 56, light shielding patterns 60, a second optical sheet 54, and a diffusion plate 70 in addition to the light source module 100-8 in accordance with the eighth embodiment. The added elements 54, 56 and 60 may be the same as those described with reference to FIG. 5.

Figure 11:
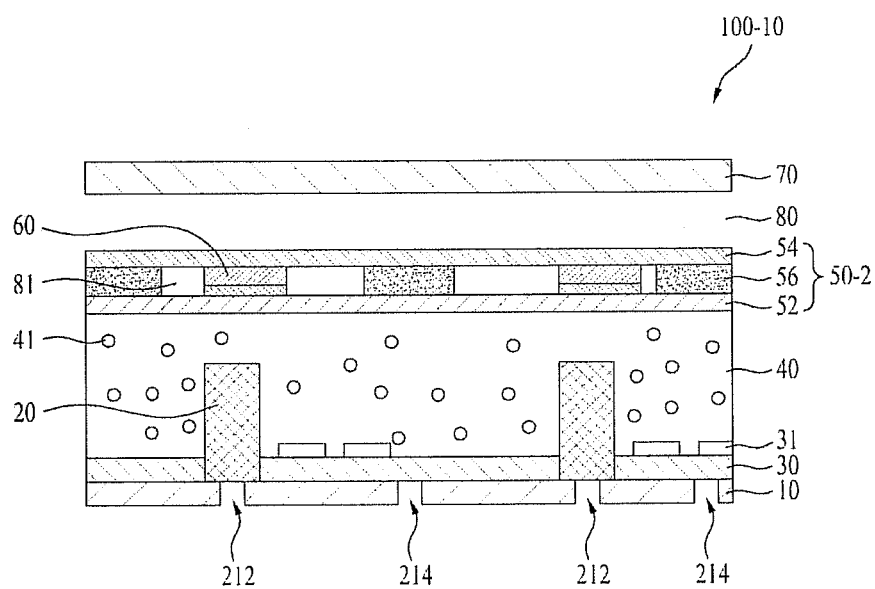

FIG. 11 illustrates a light source module 100-10 shown in FIG. 1 in accordance with a tenth embodiment. With reference to FIG. 11, the light source module 100-10 in accordance with the tenth embodiment may further include an adhesive member 56, light shielding patterns 60, a second optical sheet 54, a diffusion plate 70, and a second air gap 81 in addition to the light source module 100-8 in accordance with the eighth embodiment. The second air gap 81 may be formed between the first optical sheet 52 and the second optical sheet 54 of the light source module 100-10 in accordance with the tenth embodiment, and the second air gap 81 may be the same as that described with reference to FIG. 6.

Figure 12:
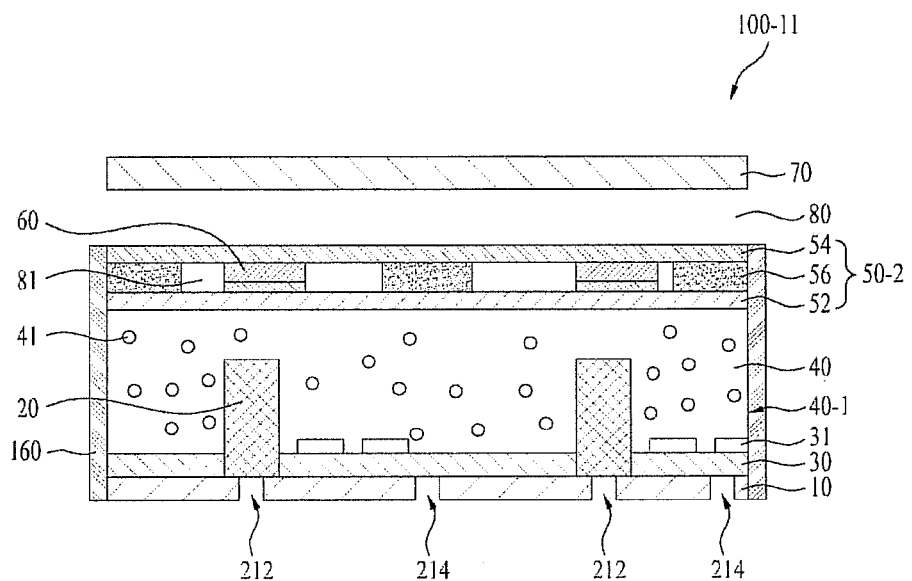

FIG. 12 illustrates a light source module 100-11 shown in FIG. 1 in accordance with an eleventh embodiment. With reference to FIG. 12, the light source module 100-11 in accordance with the eleventh embodiment may further include a light reflective member 160 in addition to the light source module 100-10 in accordance with the tenth embodiment. The light reflective member 160 may be disposed at a part or the entirety of the side surface 40-1 of the light guide layer 40. Although not shown in the drawings, a light source module in accordance with another embodiment may further include a light reflective member 160 on the side surface 40-1 of the light guide layer 40 in addition to one of the light source modules 100-7 to 100-9 in accordance with the seventh to ninth embodiments.

Figure 13:
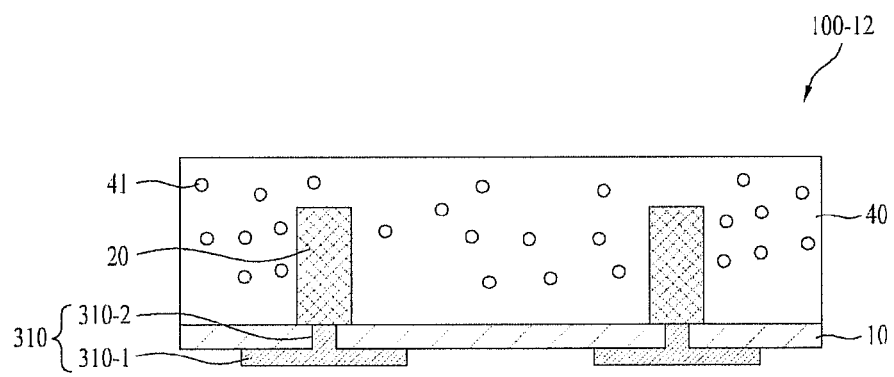

FIG. 13 illustrates a light source module 100-12 shown in FIG. 1 in accordance with a twelfth embodiment. Some parts in this embodiment which are substantially the same as those shown in FIG. 1 are denoted by the same reference numerals even though they are depicted in different drawings, and redundant description of parts in the above-mentioned description will be omitted or briefly given.

With reference to FIG. 13, differently from the heat dissipation member 110 of the light source module 100-1 in accordance with the first embodiment, a heat dissipation member 310 of the light source module 100-12 includes lower heat dissipation layers 310-1 disposed on the lower surface of the flexible printed circuit board 10, and through parts 310-1 passing through the flexible printed circuit board 10 and contacting the light emitting devices 20.

For example, the through parts 310-1 may contact a first side surface part 714 of a first lead frame 620 or 620' of a light emitting device package 200-1 or 200-2 which will be described later.

The light source module 100-12 in accordance with a twelfth embodiment transmits heat generated from the light emitting devices 20 directly to the heat dissipation member 310 by the through parts 310-1 and discharges the heat to the outside, thus improving heat dissipation efficiency.

Figure 14:
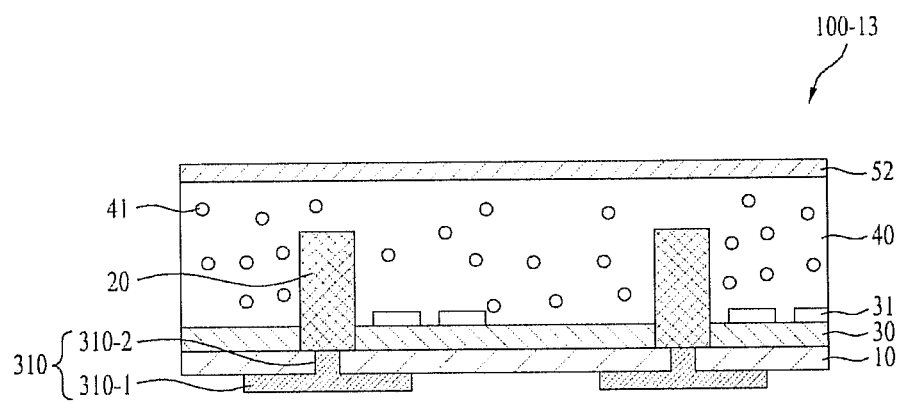

FIG. 14 illustrates a light source module 100-13 shown in FIG. 1 in accordance with a thirteenth embodiment. With reference to FIG. 14, the light source module 100-13 in accordance with the thirteenth embodiment may further include a reflective sheet 30, reflective patterns 31 and a first optical sheet 52 in addition to the light source module 100-12 in accordance with the twelfth embodiment. The added elements 30, 31 and 52 may be the same as those described with reference to FIG. 4.

Figure 15:
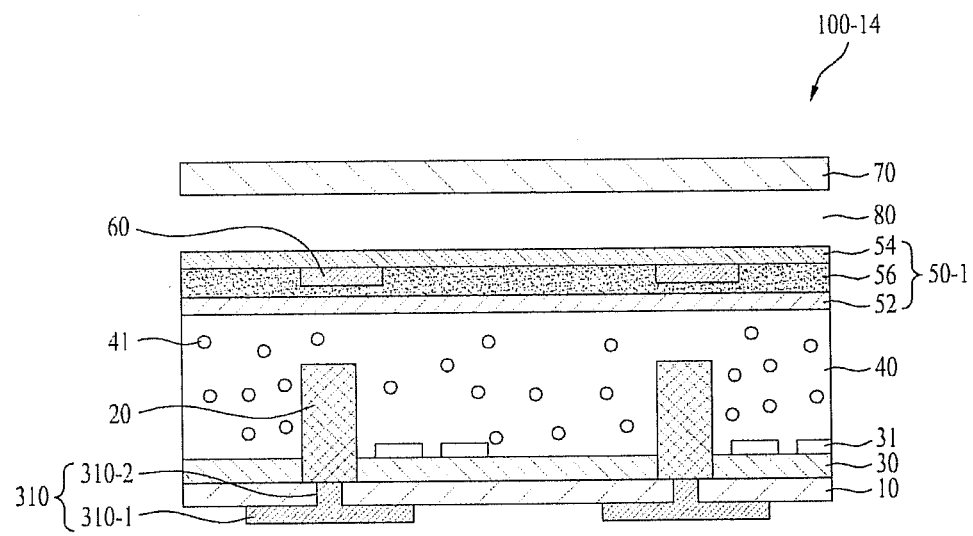

FIG. 15 illustrates a light source module 100-14 shown in FIG. 1 in accordance with a fourteenth embodiment. With reference to FIG. 15, the light source module 100-14 in accordance with the fourteenth embodiment may further include an adhesive member 56, light shielding patterns 60, a second optical sheet and 54, a diffusion plate 70 in addition to the light source module 100-13 in accordance with the thirteenth embodiment. The added elements 54, 56, 60, and 70 may be the same as those described with reference to FIG. 5.

Figure 16:
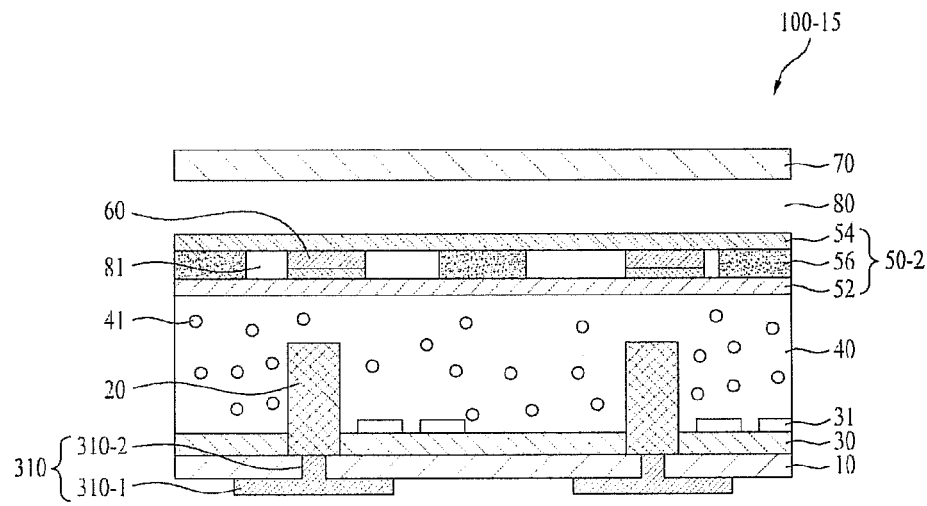

FIG. 16 illustrates a light source module 100-15 shown in FIG. 1 in accordance with a fifteenth embodiment. With reference to FIG. 15, the light source module 100-15 in accordance with the fifteenth embodiment may further include a second air gap 81 in addition to the light source module 100-14 in accordance with the fourteenth embodiment. That is, the second air gap 81 may be formed between the first optical sheet 52 and the second optical sheet 54 of the light source module 100-15 in accordance with the fifteenth embodiment, and the second air gap 81 may be the same as that described with reference to FIG. 6.

Figure 17:
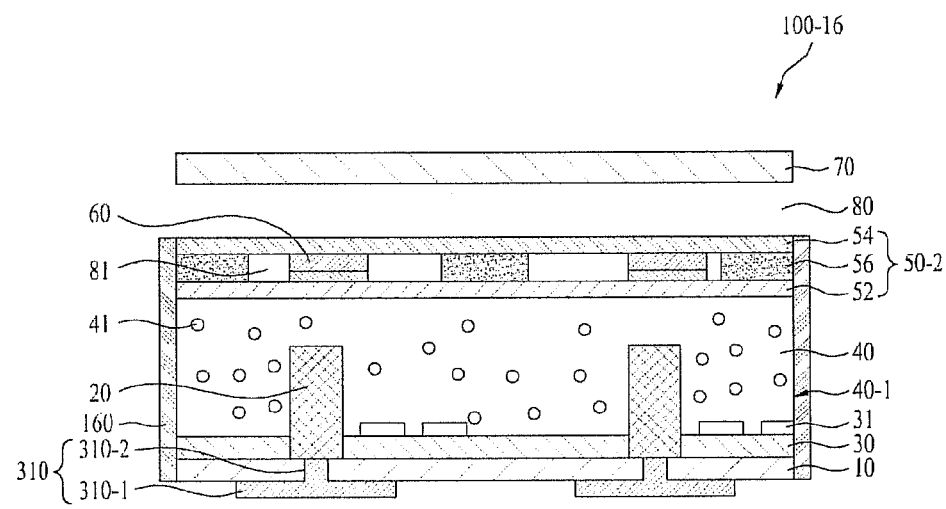

FIG. 17 illustrates a light source module 100-16 shown in FIG. 1 in accordance with a sixteenth embodiment. With reference to FIG. 17, the light source module 100-16 in accordance with the sixteenth embodiment may further include a light reflective member 160 in addition to the light source module 100-15 in accordance with the fifteenth embodiment. The light reflective member 160 may be disposed at a part or the entirety of the side surface 40-1 of the light guide layer 40. Although not shown in the drawings, a light source module in accordance with another embodiment may further include a light reflective member 160 on the side surface 40-1 of the light guide layer 40 in addition to one of the light source modules 100-12 to 100-14 in accordance with the twelfth to fourteenth embodiments.

Figure 18:
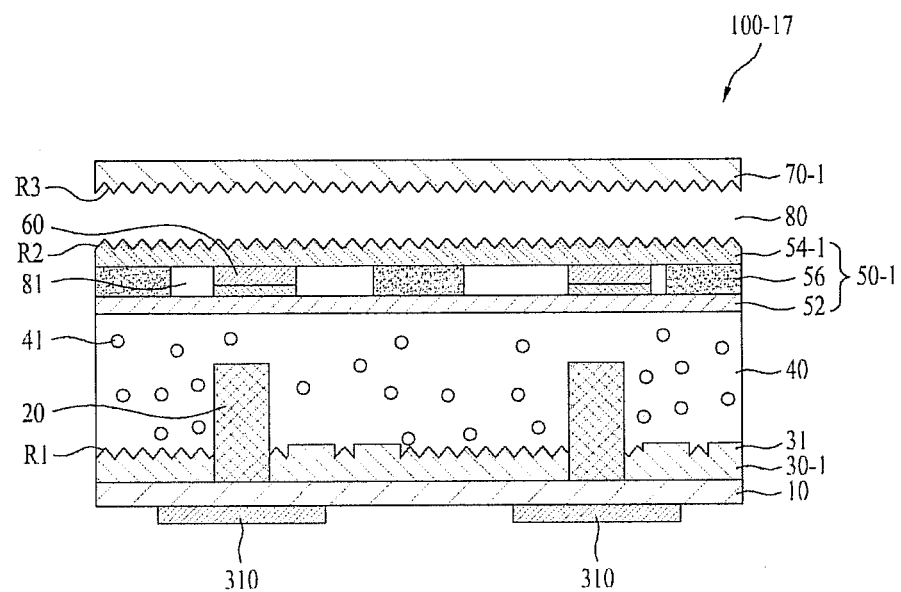
Figure 19:
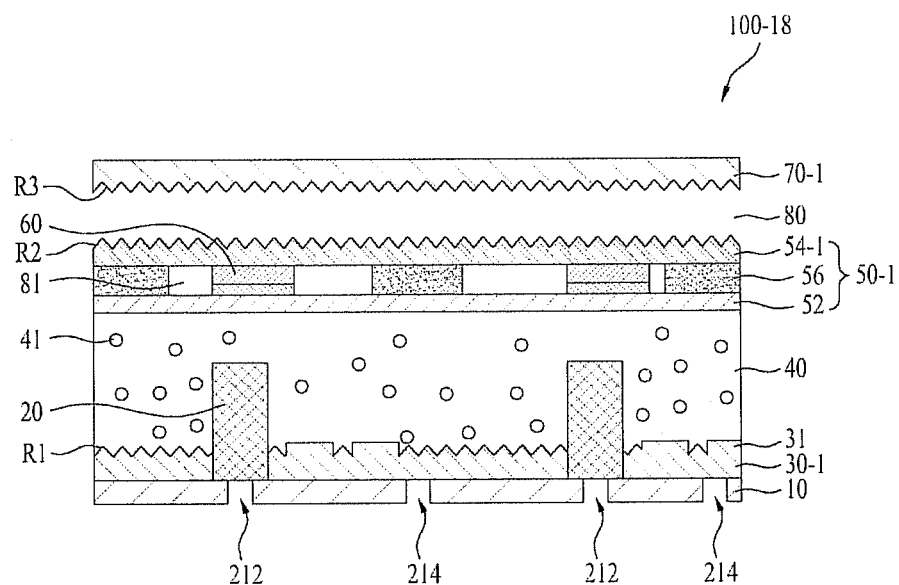
Figure 20:
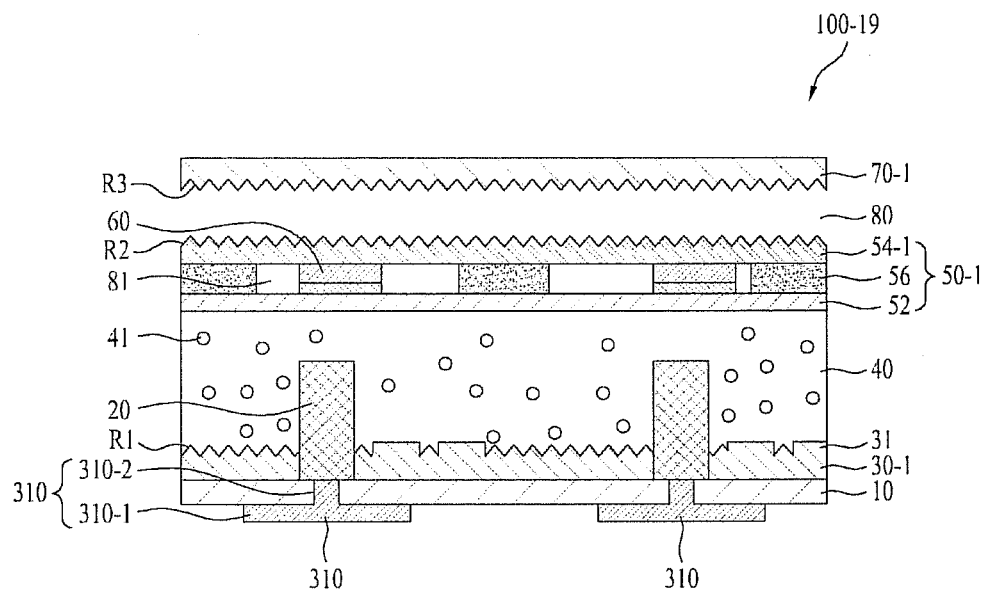

FIG. 18 illustrates a light source module 100-17 shown in FIG. 1 in accordance with a seventeenth embodiment, FIG. 19 illustrates a light source module 100-18 shown in FIG. 1 in accordance with an eighteenth embodiment, and FIG. 20 illustrates a light source module 100-19 shown in FIG. 1 in accordance with a nineteenth embodiment.

A reflective sheet 30-1, a second optical sheet 54-1 and a diffusion plate 70-1 shown in FIGS. 18 to 20 may be modifications of the reflective sheet 30, the second optical sheet 54 and the diffusion plate 70 shown in FIGS. 6, 11 and 16.

Unevennesses R1, R2 and R3 may be formed on one surface of at least one of the reflective sheet 30-1, the second optical sheet 54-1 and the diffusion plate 70-1. The unevennesses R1, R2 and R3 serve to form a geometrical pattern of light discharged to the outside by reflecting and diffusing incident light.

For example, a first unevenness R1 may be formed on one surface (for example, the upper surface) of the reflective sheet 30-1, a second unevenness R2 may be formed on one surface (for example, the upper surface) of the second optical sheet 54-1, and a third unevenness R3 may be formed on one surface (for example, the lower surface) of the diffusion plate 70-1. These unevennesses R1, R2 and R3 may be formed in a structure having a plurality of regular or irregular patterns, and in order to increase light reflecting and diffusing effects, the unevennesses R1, R2 and R3 may have a prism shape, a lenticular shape, a concave lens shape, a convex lens shape or a combinational shape thereof, but the disclosure is not limited thereto.

Further, the cross-sections of the unevennesses R1, R2 and R3 may have various shapes, such as a triangular shape, a rectangular shape, a semicircular shape, a sine wave shape, etc. Further, the sizes or densities of respective patterns of the unevennesses R1, R2 and R3 may be changed according to distances from the light emitting devices 20.

The unevennesses R1, R2 and R3 may be formed by directly processing the reflective sheet 54-1, the second optical sheet 54-1 and the diffusion plate 70-1, but the disclosure is not limited thereto. That is, the unevennesses R1, R2 and R3 may be formed in all methods which have been developed up to now and commercialized, such as a method of adhering films provided with designated patterns, or all methods which will be implemented according to future technical advances.

The light source modules 100-17, 100-18 and 100-19 in accordance with these embodiments may easily form a geometrical optical pattern through combination of the patterns of the first to third unevennesses R1, R2 and R3. In accordance with another embodiment, an unevenness may be formed on one surface or both surfaces of the first optical sheet 52.

However, the unevennesses R1, R2 and R3 are not limited to the embodiments of FIGS. 18 to 20, and an unevenness to increase light reflecting and diffusing effects may be formed on one surface or both surfaces of at least one of the reflective sheet 54, the first optical sheet 52, the second optical sheet 54 and the diffusion plate 70 in accordance with other embodiments.

Figure 22:
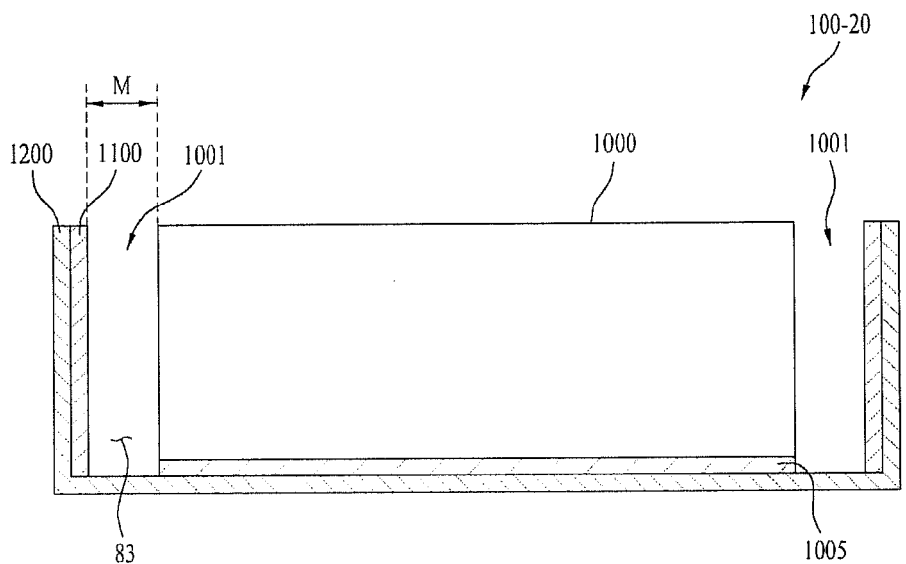
FIG. 22 is a cross-sectional view illustrating a light source module shown in FIG. 1 in accordance with a twentieth embodiment.

FIG. 22 illustrates a light source module 100-20 shown in FIG. 1 in accordance with a twentieth embodiment. With reference to FIG. 22, the light source module 100-20 in accordance with the twentieth embodiment includes a surface light emission part 1000 and an indirect light emission part 1001.

The surface light emission part 1000 converts light into surface light and then discharges the surface light to the outside. Further, the indirect light emission part 1001 reflects light irradiated by the surface light emission part 1000 to generate reflected light and thus to exert light leakage effects (or flare effects). Although FIG. 22 exemplarily illustrates the indirect light emission part 1001 as being formed on all side surfaces of the surface light emission part 1000, the indirect light emission part 1001 may be formed at least some of the side surfaces of the surface light emission part 1000.

The surface light emission part 1000 may be one of the light source modules 100-1 to 100-5, 100-7 to 100-10, 100-12 to 100-15 and 100-17 to 100-19 in accordance with the above-described embodiments.

The indirect light emission part 1001 may include a reflective member 1100 disposed on the side surface of the surface light emission part 1000. The reflective member 1100 may be separated from the surface light emission part 1000, for example, the light guide layer 40 of the surface light emission part 1000, by a designated distance M.

A third air gap 83 may be formed between the surface light emission part 1000 and the reflective member 1100. The reflective member 1100 reflects light emitted from the side surface of the light guide layer 40 of the surface light emission part 1000, thus generating reflected light (or indirect light). Therefore, flare effects in which light lost through the side surface of the light guide layer 40 is again reflected by the reflective member 1100 and is dimly spread occur, and various illumination effects applicable to interior and exterior design and vehicle illumination may be obtained using such flare effects.

In order to maximize the flare effects, the third air gap 83 may be formed between the reflective member 1100 and the surface light emission part 1000. Thus, the air gap 83 scatters light emitted from the side surface of the light guide layer 40, and the scattered light is again reflected by the reflective member 1100, thereby maximizing the flare effects. The material of the reflective member 1100 may be the same as the material of the reflective member 160 shown in FIG. 7.

The height of the reflective member 1100 may be equal to the height of one of the light guide layer 40, the first optical sheet 52, the second optical sheet 54 and the diffusion plate 70, but the disclosure is not limited thereto.

Although FIG. 22 exemplarily illustrates the reflective member 1100 as being vertical to the horizontal surface of the surface light emission part 1000, for example, the upper surface of the light guide layer 40, the reflective member 1100 may be inclined at a designated angle with respect to the horizontal surface of the surface light emission part 1000 as needed.

The light source module 100-20 shown in FIG. 22 may further include a support member 1200 surrounding the outer surfaces of the reflective member 1100 and the lower surface of the surface light emission part 1000.

The support member 1200 supports and protects the surface light emission part 1000 and the reflective member 1100, thus improving durability and reliability. The material of the support member 1200 is not limited. For example, the support member 1200 may be formed of metal or be formed of plastic. Further, the support member 1200 may be formed of a material having designated flexibility.

Figure 23:
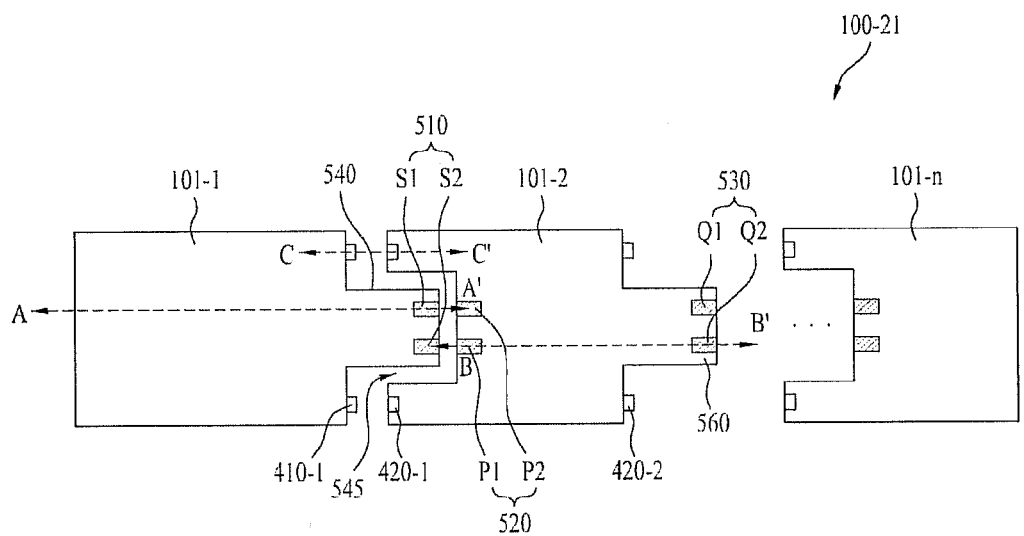
FIG. 23 is a plan view illustrating a light source module shown in FIG. 1 in accordance with a twenty first embodiment.
Figure 24:
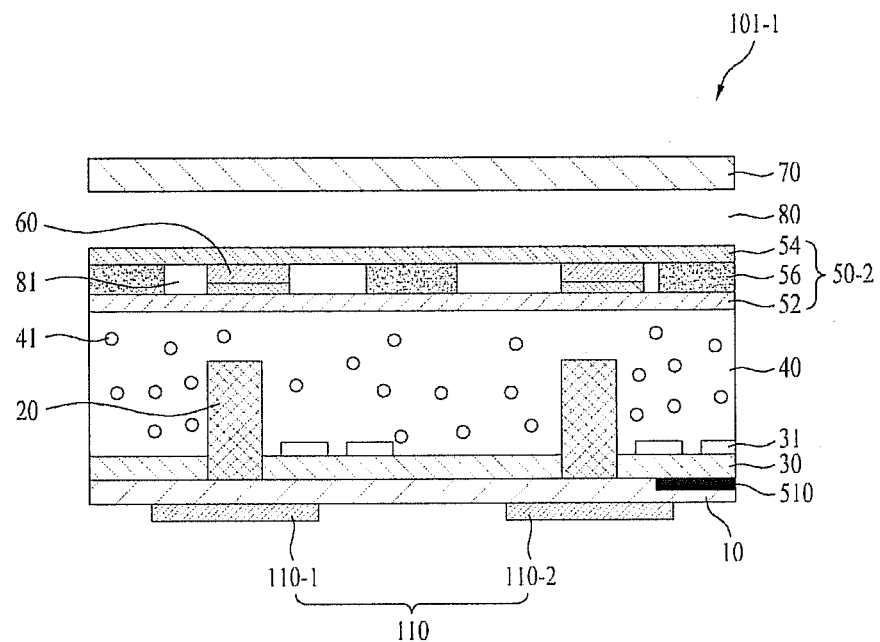
FIG. 24 is a cross-sectional view of the light source module shown in FIG. 23, taken along the line A-A'.
Figure 25:
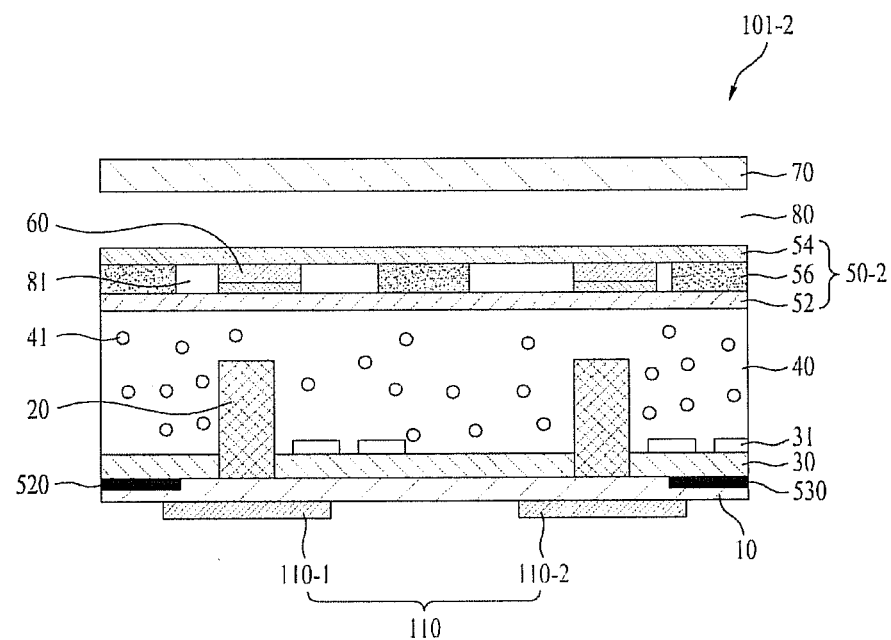
FIG. 25 is a cross-sectional view of the light source module shown in FIG. 23, taken along the line B-B'.
Figure 26:
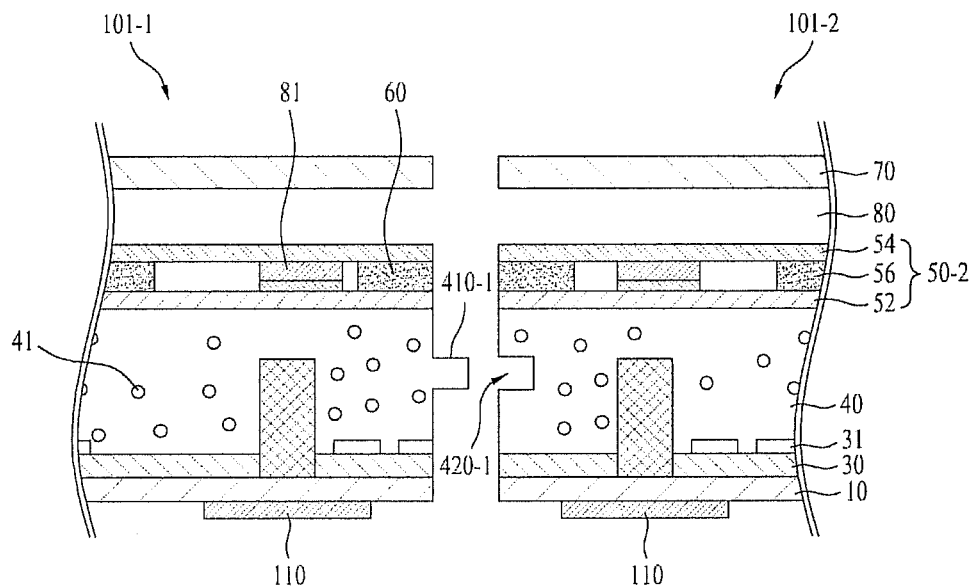
FIG. 26 is a cross-sectional view of the light source module shown in FIG. 23, taken along the line C-C'.

FIG. 23 is a plan view illustrating a light source module 100-21 shown in FIG. 1 in accordance with a twenty first embodiment, FIG. 24 is a cross-sectional view of the light source module 100-21 shown in FIG. 23, taken along the line A-A', FIG. 25 is a cross-sectional view of the light source module 100-21 shown in FIG. 23, taken along the line B-B', and FIG. 26 is a cross-sectional view of the light source module 100-21 shown in FIG. 23, taken along the line C-C'.

With reference to FIGS. 23 to 26, the light source module 100-21 includes a plurality of sub-light source modules 101-1 to 101-$n$ (n being a natural number>1), and the plural sub-light source modules 101-1 to 101-$n$ may be separated from each other and be combined with each other. Further, the combined plural sub-light source modules 101-1 to 101-$n$ may be electrically connected to each other.

Each of the sub-light source modules 101-1 to 101-$n$ includes at least one connector (for example, 510, 520 and 530) connectable to the outside. For example, a first sub-light source module 101-1 may include a first connector 510 including at least one terminal (for example, terminals 51 and S2). A second sub-light source module 101-2 may include a first connector 520 and a second connector 530 respectively connected to the outside, the first connector 520 may include at least one terminal (for example, terminals P1 and P2), and the second connector 530 may include at least one terminal (for example, terminals Q1 and Q2). Here, the first terminals 51, P1 and Q1 are positive (+) terminals, and the second terminals S2, P2 and Q2 are negative (−) terminals. Although FIG. 21 exemplarily illustrates the respective connectors (for example, 510, 520 and 530) as including two terminals, the number of terminals is not limited thereto.

FIGS. 24 to 26 illustrate a structure in which the connector 510, 520 or 530 is added to the light source module 100-5 in accordance with the fifth embodiment, but the disclosure is not limited thereto. That is, each of the sub-light source modules 101-1 to 101-$n$ may have a structure in which the connector (for example, 510, 520 or 530) and a coupling fixing part (for example, 410-1, 420-1 or 420-2) are added to one of the light source modules 100-1 to 100-20 in accordance with the above-described embodiments.

With reference to FIGS. 24 and 25, each of the sub-light source modules 101-1 to 101-$n$ includes the flexible printed circuit board 10, the light emitting devices 20, the reflective sheet 30, the reflective patterns 31, the light guide layer 40, the first optical sheet 52, the second optical sheet 54, the adhesive member 56, the optical patterns 60, the diffusion plate 70, the heat dissipation member 110, at least one connector 510, 520 or 530, and at least one coupling fixing part 410-1, 420-1 or 420-2. Some parts in this embodiment which are substantially the same as those shown in FIG. 1 are denoted by the same reference numerals even though they are depicted in different drawings, and redundant description of parts in the above-mentioned description will be omitted or briefly given. As compared with the other embodiments, the respective sub-light source modules 101-1 to 101-$n$ in accordance with the twenty first embodiment may be different in terms of the size and the number of the light emitting devices, but may have the same configuration except for the connectors and the coupling fixing parts.

The first sub-light source module 101-1 may include the first connector 510 electrically connected to the light emitting devices 20 and provided on the flexible printed circuit board 10 to be electrically connected to the outside. For example, the first connector 510 may be formed in a patterned shape on the flexible printed circuit board 10.

Further, for example, the second sub-light source modules 101-2 may include the first connector 520 and the second connector 530 electrically connected to the light emitting devices 20. The first connector 520 may be provided at one side of the flexible printed circuit board 10 to be electrically connected to the first connector 510 of the first sub-light source module 101-1, and the second connector 530 may be provided at the other side of the flexible printed circuit board 10 to be electrically connected to another external light source module (for example, a connector (not shown) of the third sub-light source module).

The coupling fixing parts (for example, 410-1, 420-1 and 420-2 serve to connect one sub-light source module to another external sub-light source module and to fix the two connected sub-light source modules to each other. The coupling fixing parts (for example, 410-1, 420-1 and 420-2) may be protrusions protruding from parts of the side surface of the light guide layer 40, or be depressions formed at parts of the side surface of the light guide layer 40.

With reference to FIG. 26, the first sub-light source module 101-1 may include the first coupling fixing part 410-1 protruding from a part of the side surface of the light guide layer 40. Further, the second sub-light source modules 101-2 may include the first coupling fixing part 420-1 depressed into a part of the side surface of the light guide layer 40 and the second coupling fixing part 420-2 protruding from another part of the side surface of the light guide layer 40.

The first coupling fixing part 410-1 of the first sub-light source module 101-1 and the second coupling fixing part 420-1 of the second sub-light source module 101-2 may be fixed through male and female screw connection.

Although this embodiment illustrates the coupling fixing parts (for example, 410-1, 420-1 and 420-2) as being implemented as parts of the light guide layer 40, the disclosure is not limited thereto. That is, separate coupling fixing parts may be provided, and the coupling fixing parts may be modified into other connectable shapes.

The sub-light source modules 101-1 to 101-$n$ ($n$ being a natural number>1) may have a shape, a designated part of which protrudes, but the disclosure is not limited thereto and the sub-light source modules 101-1 to 101-$n$ may be implemented as various shapes. For example, the plane of the sub-light source modules 101-1 to 101-$n$ seen from the top may be a circular shape, an oval shape or a polygonal shape, or a shape, a part of which protrudes in the sideward direction.

For example, one end of the first sub-light source module 101-1 may include a protrusion 540 at the center thereof, the first connector 510 may be provided on the flexible circuit board 10 at a portion corresponding to the protrusion 540, and the first coupling fixing part 410-1 may be provided on the light guide layer 40 at the remaining portion of the end of the first sub-light source module 101-1 except for the protrusion 540.

Further, one end of the second sub-light source module 101-2 may include a depression 545 at the center thereof, the first connector 520 may be provided on the flexible circuit board 10 at a portion corresponding to the depression 545, and the first coupling fixing part 420-1 may be provided on the light guide layer 40 at the remaining portion of the end of the second sub-light source module 101-2 except for the depression 545. The other end of the second sub-light source module 101-2 may include a protrusion 560 at the center thereof, the second connector 530 may be provided on the flexible circuit board 10 at a portion corresponding to the protrusion 560, and the second coupling fixing part 420-2 may be provided on the light guide layer 40 at the remaining portion of the other end of the second sub-light source module 101-2 except for the protrusion 560.

The sub-light source modules 101-1 to 101-$n$ may respectively serve as independent light sources, the shape of the sub-light source modules 101-1 to 101-$n$ may be variously modified, and two or more sub-light source modules may be assembled by the coupling fixing parts and may thus be used as an independent light source. Therefore, this embodiment may improve a degree of freedom of product design. Further, this embodiment, if some of the assembled sub-light source modules are damaged or broken, may allow only the damaged sub-light source modules to be replaced with new ones.

The above-described light source modules may be used in a display device, an indicator device and a lighting system requiring surface light sources. Particularly, the light source modules in accordance with the embodiments may be easily mounted at a place (for example, a ceiling or a floor having a bent part) which requires illumination but is provided with a bent part on which the illumination is mounted, and thus where it is not easy to install the illumination. For example, the lighting system may include a lamp or a streetlamp, and the lamp may be a head lamp for vehicles but the disclosure is not limited thereto.

Figure 27:
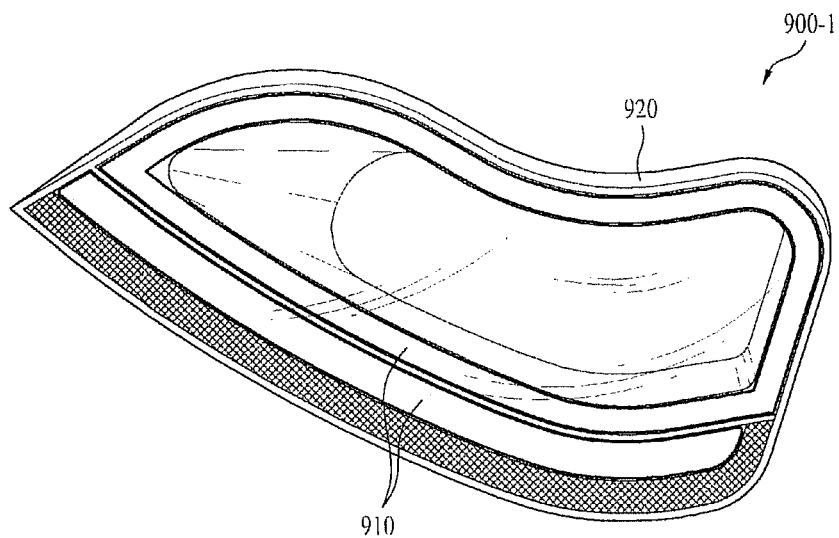
FIG. 27 is a perspective view illustrating a head lamp for vehicles in accordance with one embodiment.
Figure 49:
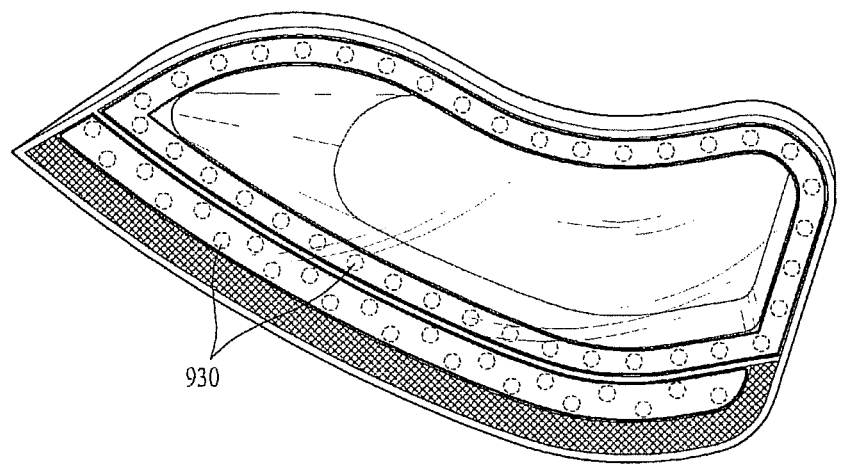
FIG. 49 is a perspective view illustrating a general head lamp for vehicles which is a point light source.

FIG. 27 is a perspective view illustrating a head lamp 900-1 for vehicles in accordance with one embodiment, and FIG. 49 is a perspective view illustrating a general head lamp for vehicles which is a point light source. With reference to FIG. 27, the head lamp 900-1 for vehicles includes a light source module 910 and a light housing 920.

The light source module 910 may be one of the light source modules 100-1 to 100-21 in accordance with the above-described embodiments. The light housing 920 may accommodate the light source module 910 and be formed of a light transmitting material. The light housing 920 for vehicles may include a bent part according to vehicle regions on which the light housing 920 is mounted and vehicle designs. Since the light source module 910 uses the flexible circuit board 10 and the light guide layer 40 and thus has flexibility, the light source module 910 may be easily mounted on the light housing 920 for vehicles having the bent part. Further, since the light source modules 100-1 to 100-21 have a structure with improved heat dissipation efficiency, the head lamp 900-1 for vehicles in accordance with this embodiment may prevent generation of wavelength shift and brightness reduction.

The general head lamp for vehicles shown in FIG. 49 is a point light source, and thus may generate partial spots on a light emission surface during emission of light. However, the head lamp 900-1 for vehicles in accordance with this embodiment is a surface light source, and thus does not generate spots but may achieve uniform brightness and luminous intensity throughout a light emission surface.

Figure 28:
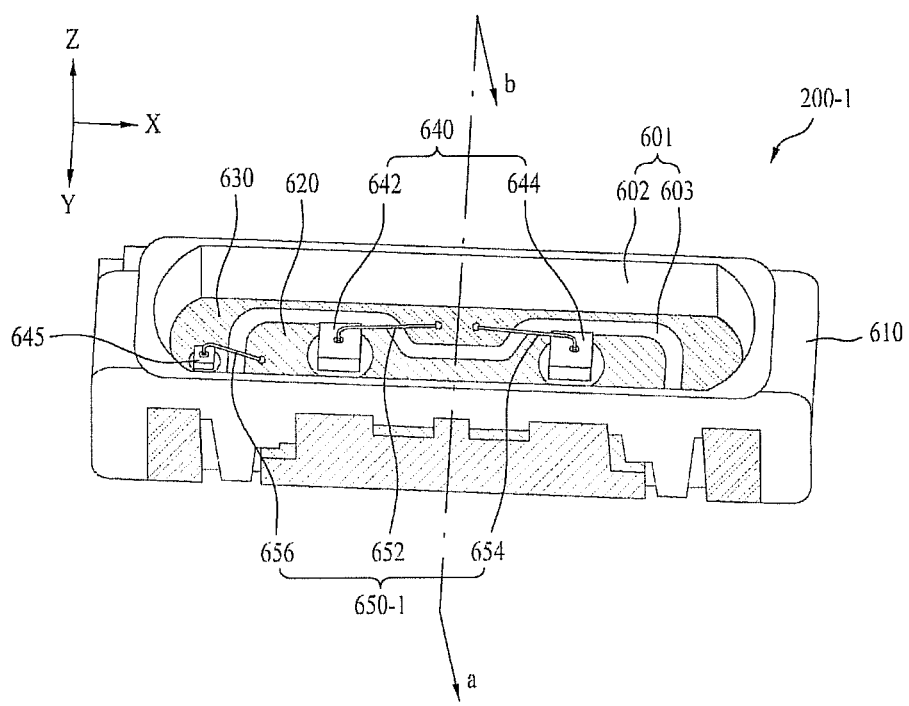
FIG. 28 is a perspective view of a light emitting device package in accordance with a first embodiment.
Figure 29:
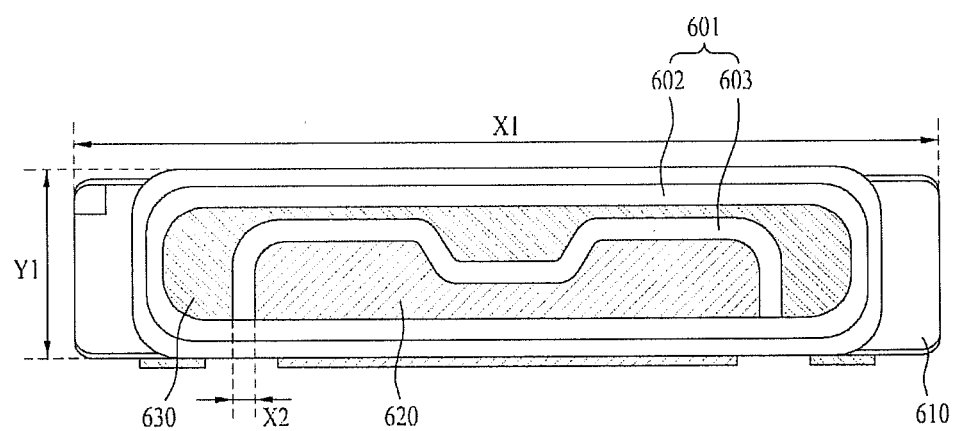
FIG. 29 is a top view of the light emitting device package in accordance with the first embodiment.
Figure 30:
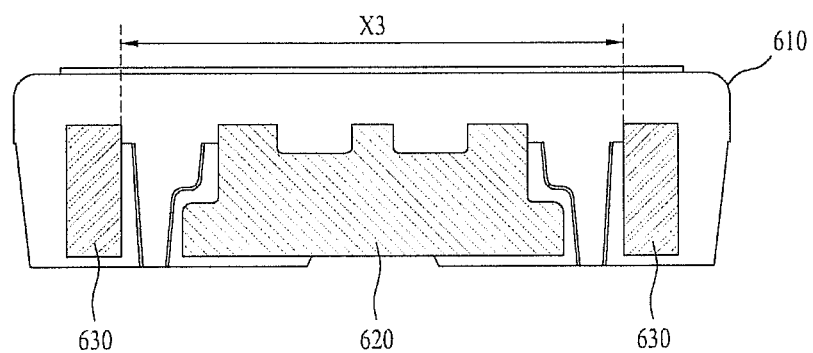
FIG. 30 is a front view of the light emitting device package in accordance with the first embodiment.
Figure 31:
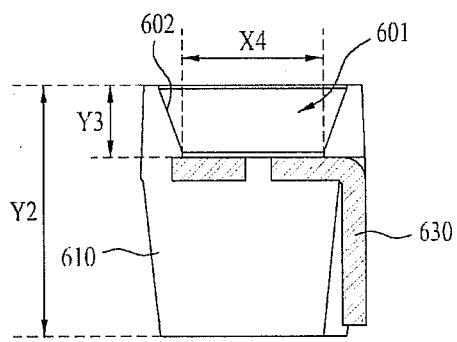
FIG. 31 is a side view of the light emitting device package in accordance with the first embodiment.

FIG. 28 is a perspective view of a light emitting device package 200-1 in accordance with a first embodiment, FIG. 29 is a top view of the light emitting device package 200-1 in accordance with the first embodiment, FIG. 30 is a front view of the light emitting device package 200-1 in accordance with the first embodiment, and FIG. 31 is a side view of the light emitting device package 200-1 in accordance with the first embodiment.

The light emitting device package 200-1 shown in FIG. 28 may be a light emitting device package included in one of the light source modules 100-1 to 100-21 in accordance with the above-described embodiments, but the disclosure is not limited thereto.

With reference to FIGS. 28 to 31, the light emitting device package 200-1 includes a package body 610, a first lead frame 620, a second lead frame 630, light emitting chips 640, a Zener diode 645 and wires 650-1.

The package body 610 may be formed of a substrate having high insulation and thermal conductivity, such as a silicon-based wafer level package, a silicon substrate, a silicon carbide (SiC) substrate or a aluminum nitride (AlN) substrate, and may have a structure in which a plurality of substrates is stacked. However, the disclosure is not limited to the above-described material, structure and shape of the package body 610.

For example, the length X1 of the package body 610 in a first direction (for example, in the X-axis direction) may be 5.95 mm~6.05 mm and the length Y1 of the package body 610 in a second direction (for example, in the Y-axis direction) may be 1.35 mm~1.45 mm The length Y2 of the package body 610 in a third direction (for example, in the Z-axis direction) may be 1.6 mm~7 mm For example, the first direction may be a direction in parallel with the long side of the package body 610.

The package body 610 may include a cavity 601 provided with an opened upper portion and including a side wall 602 and a bottom 603. The cavity 601 may be formed in a cup shape and a concave container shape, and the side wall 602 of the cavity 601 may be vertical to or inclined with respect to the bottom 603. The shape of the cavity 601 seen from the top may be a circle, an oval or a polygon (for example, a rectangle). The corners of the polygonal cavity 601 may be curved. For example, the length X3 of the cavity 601 in the first direction (for example, in the X-axis direction) may be 4.15 mm~4.25 mm the length X4 of the cavity 601 in the second direction (for example, in the Y-axis direction) may be 0.64 mm~0.9 mm and the depth Y3 of the cavity 601 (for example, the length of the cavity 601 in the Z-axis direction) may be 0.33 mm~0.53 mm The first lead frame 620 and the second lead frame 630 may be disposed on the surface of the package body 610 such that the first and second lead frames 620 and 630 are electrically isolated from each other in consideration of heat discharge or mounting of the light emitting chips 640. The light emitting chips 640 are electrically connected to the first lead frame 620 and the second lead frame 630. The number of the light emitting chips 640 may be 1 or more.

A reflective member (not shown) reflecting light emitted from the light emitting chips 640 in a designated direction may be provided on the side wall 602 of the cavity 601 of the package body 610.

The first lead frame 620 and the second lead frame 630 may be separated from each other within the upper surface of the package body 610. A part of the package body 610 (for example, the bottom 603 of the cavity 601) is located between the first lead frame 620 and the second lead frame 630, and may thus electrically separate the first lead frame 620 and the second lead frame 630 from each other.

The first lead frame 620 may include one end (for example 712) exposed to the cavity 601 and the other end (for example 714) passing through the package body 610 and exposed to one surface of the package body 610. Further, the second lead frame 630 may include one end (for example, 744-1) exposed to one side of one surface of the package body 610, the other end (for example, 744-2) exposed to the other side of the surface of the package body 610, and an intermediate part 742-2 exposed to the cavity 601.

A separation distance X2 between the first lead frame 620 and the second lead frame 630 may be 0.1 mm~0.2 mm The upper surface of the first lead frame 620 and the upper surface of the second lead frame 630 may be coplanar with the bottom 603 of the cavity 601.

Figure 32:
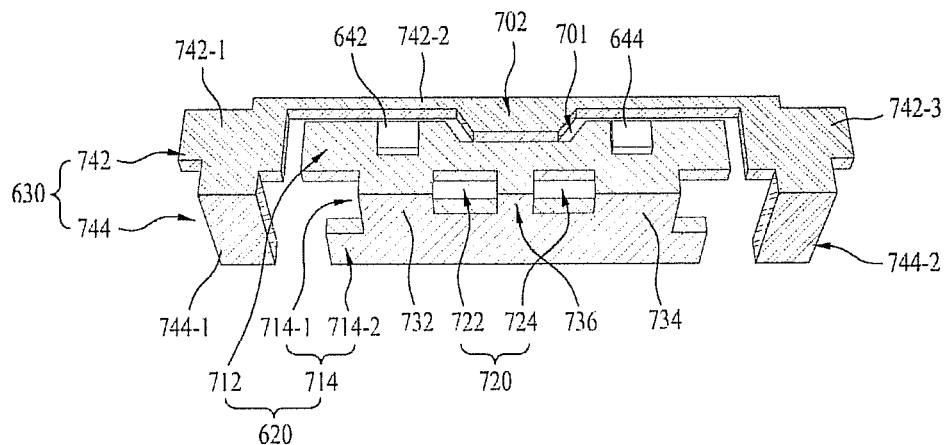
FIG. 32 is a perspective view illustrating a first lead frame and a second lead frame shown in FIG. 28.
Figure 33:
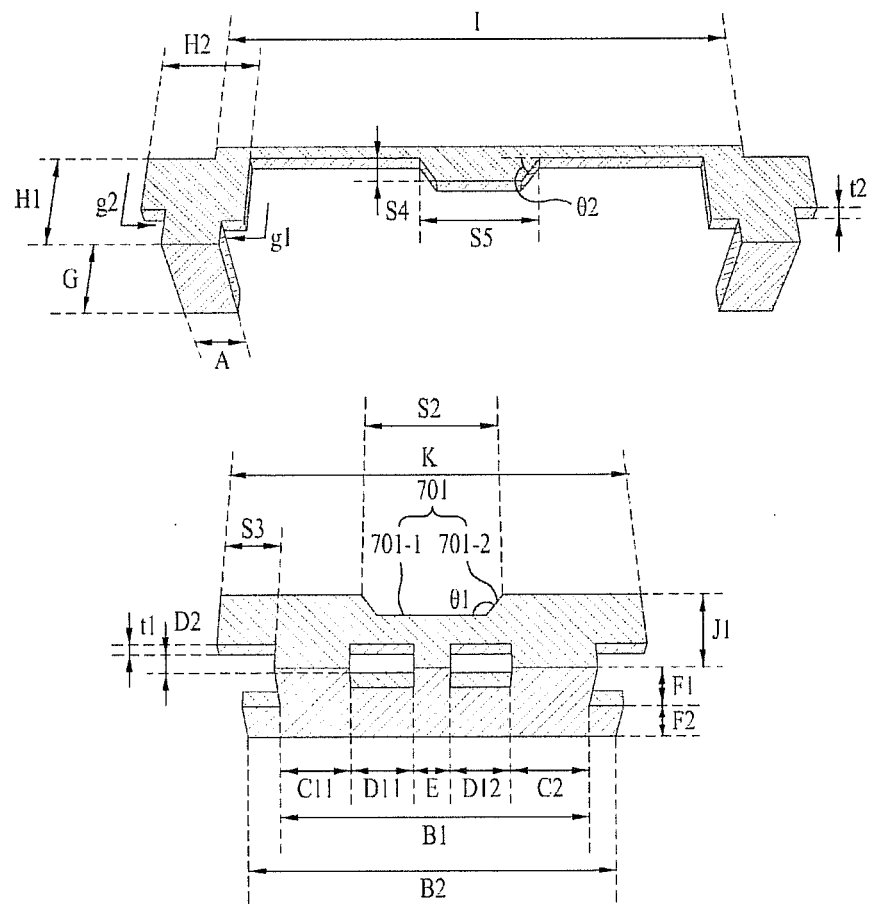
FIG. 33 is a cross-sectional view illustrating sizes of respective parts of the first lead frame and the second lead frame shown in FIG. 32.
Figure 34:
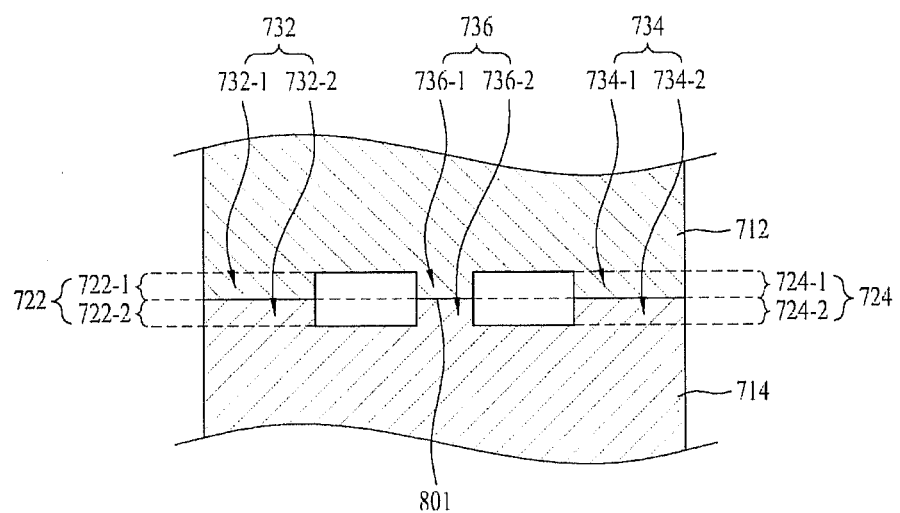
FIG. 34 is an enlarged view illustrating connection parts shown in FIG. 33.

FIG. 32 is a perspective view illustrating the first lead frame 620 and the second lead frame 630 shown in FIG. 28, FIG. 33 is a cross-sectional view illustrating the sizes of respective parts of the first lead frame 620 and the second lead frame 630 shown in FIG. 32, and FIG. 34 is an enlarged view illustrating connection parts 732, 734 and 736 of the first lead frame 620 adjacent to a boundary part 801 between a first upper surface part 712 and a first side surface part 714 shown in FIG. 33.

With reference to FIGS. 32 to 34, the first lead frame 620 includes the first upper surface part 712 and the second side surface part 714 bent from a first side portion of the first upper surface part 712.

The first upper surface part 712 may be coplanar with the bottom 603 of the cavity 601 and be exposed by the cavity 601, and light emitting chips 642 and 644 may be disposed on the first upper surface part 712.

As shown in FIG. 33, both ends of the first upper surface part 712 may include a protrusion S3 protruding in the first direction (in the X-axis direction) with respect to the first side surface part 714. The protrusions S3 of the first upper surface part 712 may support the first lead frame of a lead frame array. The length of the protrusions S3 of the first upper surface part 712 in the first direction may be 0.4 mm~0.5 mm The length K of the first upper surface part 712 in the first direction may be 3.45 mm~3.55 mm and the length J1 of the first upper surface part 712 in the second direction may be 0.6 mm~0.7 mm The first direction may be the X-axis direction and the second direction may be the Y-axis direction in the XYZ coordinate system.

A second side portion of the first upper surface part 712 may include at least one depression 701. Here, the second side portion of the first upper surface part 712 may be opposite the first side portion of the first upper surface part 712. For example, although the second side portion of the first upper surface part 712 may include one depression 701 at the center thereof, the disclosure is not limited thereto and the number of depressions formed on the side surface portion may be 2 or more. The depression 701 may have a shape corresponding to a protrusion 702 provided on the second lead frame 630 which will be described later.

Although the depression 701 shown in FIG. 33 has a trapezoidal shape, the disclosure is not limited thereto and the depression 701 may have various shapes, such as a circular shape, a polygonal shape, an oval shape, etc. The length S2 of the depression 701 in the first direction may be 1.15 mm~1.25 mm and the length S1 of the depression 701 in the second direction may be 0.4 mm~0.5 mm The angle θ1 formed by a bottom 701-1 and a side surface 701-2 of the depression 701 may be 90° or more and be smaller than 180°. The light emitting chips 642 and 633 may be disposed on the first upper surface part 712 at both sides of the depression 701.

The first side surface part 714 may be bent downwardly from the first side portion of the first upper surface part 712 at a designated angle, and may be exposed from one side surface of the package body 610. For example, the angle formed by the first upper surface part 712 and the first side surface part 714 may be 90° or more and be smaller than 180°.

The first lead frame 620 may include one or more through holes 720 on at least one of the first upper surface part 712 and the first side surface part 714. For example, the first lead frame 620 may include one or more through holes 720 adjacent to the boundary part between the first upper surface part 712 and the first side surface part 714. Although FIG. 32 illustrates two through holes 722 and 724 separated from each other as being located at the boundary part between the first upper surface part 712 and the first side surface part 714, the disclosure is not limited thereto.

The one or more through holes 720 may be formed at one region of each of the first upper surface part 712 and the first side surface part 714 adjacent to the boundary part between the first upper surface part 712 and the first side surface part 714. Here, a through hole 722-1 formed at one region of the first upper surface part 712 and a through hole 722-2 formed at one region of the first side surface part 714 may be connected.

The through holes 720 may serve to improve coupling between the first lead frame 620 and the package body 610 by filling a portion of the package body 610 within the through holes 720. Further, the through holes 720 may serve to easily form a bent part between the first upper surface part 712 and the first side surface part 714. However, if the size of the through holes 720 is excessively large or the number of the through holes 720 is excessively large, the first upper surface part 712 and the first side surface part 714 may be cut off when the first lead frame 620 is bent, and thus the size and number of the through holes 720 need to be properly adjusted. Further, the size of the through holes 720 relates to the size of the connection parts 732, 734 and 736 which will be described later, and thus relates to heat dissipation of the light emitting device package.

The embodiment illustrating the sizes of the first lead frame 620 having through holes and the second lead frame 630 which will be described hereinafter, may exert the optimum heat dissipation efficiency in consideration of a coupling degree with the package body 610 and ease of bending.

In order to improve the coupling degree with the package body 610, to facilitate bending of the first lead frame 620 and to prevent damage to the first lead frame 620 during bending of the first lead frame 620, the light emitting device package in accordance with this embodiment may include the first through hole 722 and the second through hole 724, the length D11 of the first through hole 722 in the first direction and the length D12 of the second through hole 724 in the first direction may be 0.58 mm~0.68 mm and the length D2 of the first and second through holes 722 and 724 in the second direction may be 0.19 mm~0.29 mm The area of the first through hole 722 may be equal to the area of the second through hole 724, but the disclosure is not limited thereto and the areas of the first and second through holes 722 and 724 may be different.

With reference to FIG. 34, the first lead frame 620 may include the connection parts 732, 734 and 736 located adjacent to the boundary part 801 between the first upper surface part 712 and the first side surface part 714, separated from each other by the through holes 720, and connecting the first upper surface part 712 and the first side surface part 714. For example, the connection parts 732, 734 and 736 may respectively include first parts 732-1, 734-1, 736-1 corresponding to portions of the first upper surface part 712, and second parts 732-2, 734-2, 736-2 corresponding to portions of the first side surface part 714. The through holes 720 may be located between the respective connection parts 732, 734 and 736.

The first lead frame 620 may include at least one connection part corresponding to or be aligned with the light emitting chip 642 or 644.

In more detail, the first lead frames may include first to third connection parts 732, 734 and 736. The first connection part 732 may be located to correspond to or be aligned with the first light emitting chip 642, and the second connection part 734 may be located to correspond to or be aligned with the second light emitting chip 644. The third connection part 736 may be located between the first connection part 732 and the second connection part 734, and are not aligned with the first light emitting chip 642 and the second light emitting chip 644. For example, the third connection part 736 may be located to correspond to or be aligned with the depression 701 of the first lead frame 620, but the disclosure is not limited thereto.

The length C11 of the first connection part 732 in the first direction and the length C2 of the second connection part 734 in the first direction may be greater than the length E of the third connection part 736 in the first direction. For example, the length C11 of the first connection part 732 in the first direction and the length C2 of the second connection part 734 in the first direction may be 0.45 mm~0.55 mm and the length E of the third connection part 736 in the first direction may be 0.3 mm~0.4 mm The reason for location of the third connection part 736 between the first through hole 722 and the second through hole 724 is to prevent cut between the first upper surface part 712 and the first side surface part 714 during bending of the first lead frame 620.

The ratio of the length E of the third connection part 736 in the first direction to the length C11 of the first connection part 732 in the first direction may be 1:1.2~1.8. The ratio of the length D11 or D12 of the first or second through hole 722 or 724 to the length B1 of an upper end 714-1 of the first side surface part 714 may be 1:3.8.

Since the first connection part 732 is aligned with the first light emitting chip 642 and the second connection part 734 is aligned with the second light emitting chip 644, heat generated from the first light emitting chip 642 may be discharged to the outside mainly through the first connection part 732 and heat generated from the second light emitting chip 644 may be discharged to the outside mainly through the second connection part 734.

In this embodiment, since the lengths C11 and C2 of the first connection part 732 and the second connection part 734 in the first direction are greater than the length E of the third connection part 736 in the first direction, the areas of the first connection part 732 and the second connection part 734 are greater than the area of the third connection part 736. Therefore, the light emitting device package in accordance with this embodiment may improve efficiency of discharging heat generated from the first light emitting chip 642 and the second light emitting chip 644 by increasing the areas of the connection parts 732 and 734 adjacent to the light emitting devices 20.

The first side surface part 714 may be divided into the upper end 714-1 connected to the first upper surface part 712 and a lower end 714-2 connected to the upper end 714-1. That is, the upper end 714-1 may include portions of the first to third connection parts 732, 734 and 736, and the lower end 714-2 may be located under the upper end 714-1.

The length F1 of the upper end 714-1 in the third direction may be 0.6 mm~0.7 mm and the length F2 of the lower end 714-2 in the third direction may be 0.4 mm~0.5 mm The third direction may be the Z-axis direction in the XYZ coordinate system.

In order to improve coupling with the package body 610 and air tightness to block moisture, the side surface of the upper end 714-1 and the side surface of the lower end 714-2 may be stepped. For example, both side ends of the lower end 714-2 may protrude in the sideward direction with respect to the side surface of the upper end 714-1. The length B1 of the upper end 714-1 in the first direction may be 2.56 mm~2.66 mm and the length B2 of the lower end 714-2 in the first direction may be 2.7 mm~3.7 mm The thickness t1 of the first lead frame 620 may be 0.1 mm~0.2 mm The second lead frame 630 may be disposed to surround at least one side portion of the first lead frame 620. For example, the second lead frame 620 may be disposed around remaining side portions except for the first side surface part 714 of the first lead frame 630.

The second lead frame 630 may include a second upper surface part 742 and a second side surface part 744. The second upper surface part 742 may be disposed to surround remaining side portions except for a first side portion of the first upper surface part 712. As shown in FIGS. 28 and 32, the second upper surface part 742 may be coplanar with the bottom 603 of the cavity 601 and the first upper surface part 712, and be exposed by the cavity 601. The thickness t2 of the second lead frame 630 may be 0.1 mm~0.2 mm The second upper surface part 742 may be divided into a first portion 742-1, a second portion 742-2 and a third portion 742-3 according to positions surrounding the first upper surface part 712. The second portion 742-2 of the second upper surface part 742 may correspond to or be opposite the second side portion of the first upper surface part 712. The first portion 742-1 of the second upper surface part 742 may be connected to one end of the second portion 742-2, and may correspond to or be opposite to one of the remaining side portions of the first upper surface part 712. The third portion 742-3 of the second upper surface part 742 may be connected to the other end of the second portion 742-2, and may correspond to or be opposite to another of the remaining side portions of the first upper surface part 712.

The length H1 of the first portion 742-1 and the third portion 742-3 in the second direction may be 0.65 mm~0.75 mm and the length H2 of the first portion 742-1 and the third portion 742-3 in the first direction may be 0.78 mm~0.88 mm The length l of the second portion 742-2 in the first direction may be 4.8 mm~4.9 mm The second portion 742-2 of the second upper surface part 742 may include the protrusion 702 corresponding to the depression 701 of the first upper surface part 712. For example, the shape of the protrusion 702 may match the shape of the depression 701, and the protrusion 702 may be located to be aligned with the depression 701. The protrusion 702 may be located within the depression 701. The number of protrusions 702 may be equal to the number of depressions 701. The protrusion 702 and the depression 701 may be separated from each other, and a portion of the package body 610 may be located therebetween. The protrusion 702 is an area for wire bonding with the first light emitting chip 642 and the second light emitting chip 644, and is located between the first light emitting chip 642 and the second light emitting chip 644, thus facilitating wire bonding with the first light emitting chip 642 and the second light emitting chip 644.

The length S5 of the protrusion 702 in the first direction may be 0.85 mm~0.95 mm the length S4 of the protrusion 702 in the second direction may be 0.3 mm~0.4 mm and the angle θ2 formed by the protrusion 702 and the second portion 742-2 may be 90° or more and be smaller than 180°.

The second side surface part 744 may be bent from at least one side portion of the second upper surface part 742. The second side surface part 744 may be bent downwardly from the second upper surface part 742 at a designated angle (for example, 90°).

For example, the second side surface part 744 may include a first portion 744-1 bent from one side portion of the first portion 742-1 of the second upper surface part 742 and a second portion 744-2 bent from one side portion of the third portion 742-3 of the second upper surface part 742.

The first portion 744-1 and the second portion 744-2 of the second side surface part 744 may be bent to be located on the same side surface of the second lead frame 630. The first portion 744-1 of the second side surface part 744 may be separated from the first side surface part 714, and may be located at one side (for example, the left side) of the first side surface part 714. The second portion 744-2 of the second side surface part 744 may be separated from the first side surface part 714, and may be located at the other side (for example, the right side) of the first side surface part 714. The first side surface part 714 and the second side surface part 744 may be coplanar with each other. Consequently, as shown in FIG. 28, the first side surface part 714 and the second side surface part 744 may be exposed to the same side surface of the package body 610. The length A of the second side surface part 744 in the first direction may be 0.4 mm~0.5 mm and the length G of the second side surface part 744 in the third direction may be 1.05 mm~1.15 mm One side surface of each of the first portion 742-1 and the third portion 742-3 of the second upper surface part 742 may have a stepped portion g1. For example, the stepped portion g1 may be located adjacent to a region where one side surface of the first portion 742-1 of the second upper surface part 742 and one side surface of the first portion 744-1 of the second side surface part 744 meet. Since the area of the first upper surface part 712 and the first side surface part 714 may be increased by the stepped portions g1, the light emitting device package in accordance with this embodiment may increase a heat dissipation area and thus improve heat dissipation efficiency. Because the area of the first lead frame 620 relates to discharge of heat generated from the light emitting chips 642 and 644.

The other side surface of each of the first portion 742-1 and the third portion 742-3 of the second upper surface part 742 may have a stepped portion g2. The reason for formation of the stepped portions g2 is to allow a bonding material (for example, solder) to be easily observed with the naked eye when the light emitting device package 200-1 is bonded to the flexible printed circuit board 10.

The first side surface part 714 of the first lead frame 620 and the second side surface part 744 of the second lead frame 630 may be mounted on and contact the flexible printed circuit board 10 of each of the light source modules 100-1 to 100-21 in accordance with the embodiments, and thereby, the light emitting chips 640 may irradiate light in a direction 3 toward the side surface of the light guide layer 40. That is, the light emitting device package 200-1 may have a side view type structure.

The Zener diode 645 may be disposed on the second lead frame 630 to improve withstand voltage of the light emitting device package 200-1. For example, the Zener diode 645 may be disposed on the second upper surface part 742 of the second lead frame 630.

The first light emitting chip 642 may be electrically connected to the second lead frame 630 by a first wire 652, the second light emitting chip 644 may be electrically connected to the second lead frame 630 by a second wire 654, and the Zener diode 645 may be electrically connected to the first lead frame 620 by a third wire 656.

For example, one end of the first wire 652 may be connected to the first light emitting chip 642, and the other end of the first wire 652 may be connected to the protrusion 702. Further, one end of the second wire 654 may be connected to the second light emitting chip 644, and the other end of the second wire 654 may be connected to the protrusion 702.

The light emitting device package 200-1 may further include a resin layer (not shown) filling the inside of the cavity 601 to surround the light emitting chips 640. The resin layer may be formed of a colorless transparent polymer resin material, such as epoxy or silicon.

The light emitting device package 200-1 may produce red light using only red light emitting chips without a phosphor, but the disclosure is not limited thereto. The resin layer may include a phosphor so as to change the wavelength of light emitted from the light emitting chips 640. For example, although light emitting chips emitting colored light other than red light are used, a light emitting device package emitting desired colored light by changing the wavelength of light using a phosphor may be implemented.

Figure 35:
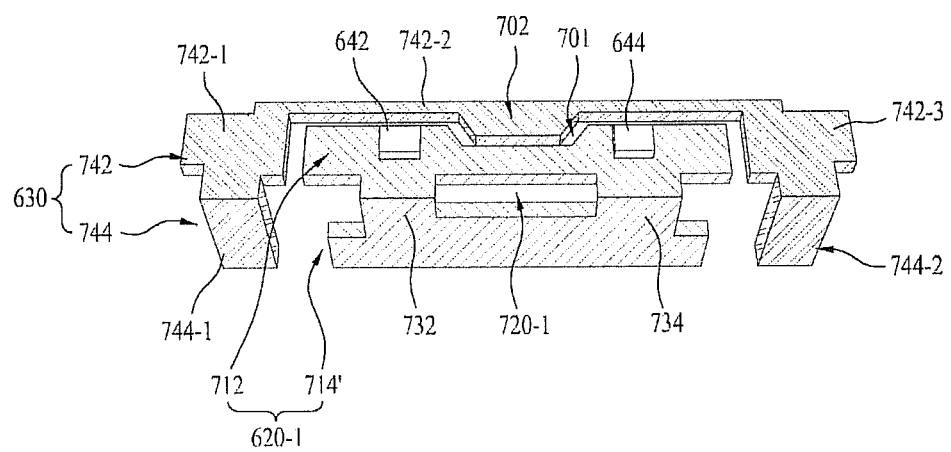
FIGS. 35 to 40 are cross-sectional views illustrating first lead frames and second lead frames in accordance with other embodiments.

FIG. 35 illustrates a first lead frame 620-1 and a second lead frame 630 in accordance with another embodiment. Some parts in this embodiment which are substantially the same as those shown in FIG. 32 are denoted by the same reference numerals even though they are depicted in different drawings, and redundant description of parts in the above-mentioned description will be omitted or briefly given.

With reference to FIG. 35, the first lead frame 620-1 has a structure in which the third connection part 736 is removed from the first lead frame 620 shown in FIG. 32. That is, the first lead frame 620-1 may include one through hole 720-1 adjacent to a boundary part between a first upper surface part 712 and a first side surface part 714'. A first connection part 732 may be located at one side of the through hole 720-1, and a second connection part 734 may be located at the other side of the through hole 720-1.

Figure 36:
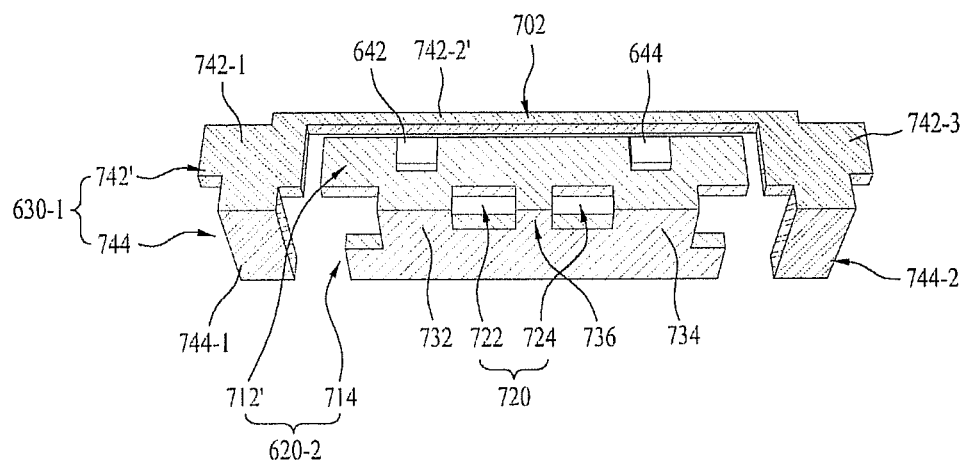

FIG. 36 illustrates a first lead frame 620-2 and a second lead frame 630-1 in accordance with another embodiment. Some parts in this embodiment which are substantially the same as those shown in FIG. 32 are denoted by the same reference numerals even though they are depicted in different drawings, and redundant description of parts in the above-mentioned description will be omitted or briefly given.

With reference to FIG. 36, a first upper surface part 712' of the first lead frame 620-1 may have a structure in which the depression 701 is omitted from the first upper surface part 712 of the first lead frame 620 shown in FIG. 32. Further, a second portion 742-2' of a second upper surface part 742' of the second lead frame 630-1 may have a structure in which the protrusion 702 is omitted from the second portion 742-2 of the second upper surface part 742 of the second lead frame 630 shown in FIG. 32. Other elements in accordance with this embodiment may be the same as those shown in FIG. 32.

Figure 37:
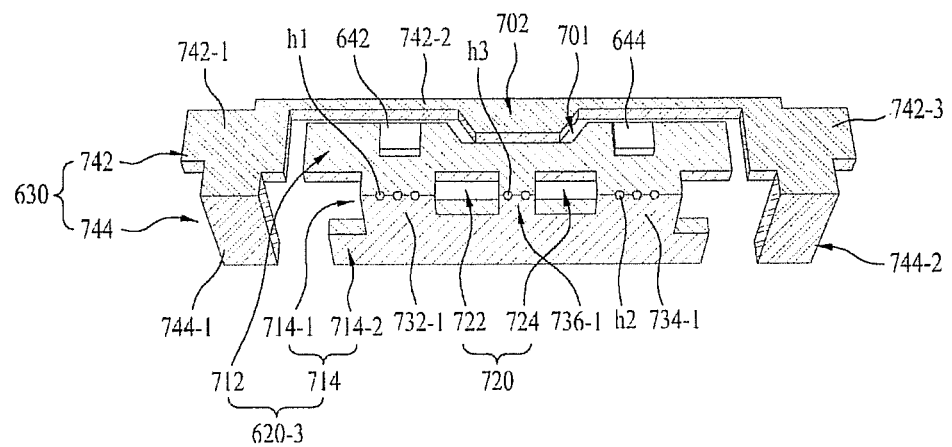

FIG. 37 illustrates a first lead frame 620-3 and a second lead frame 630 in accordance with another embodiment. Some parts in this embodiment which are substantially the same as those shown in FIG. 32 are denoted by the same reference numerals even though they are depicted in different drawings, and redundant description of parts in the above-mentioned description will be omitted or briefly given.

With reference to FIG. 37, the first lead frame 620-3 may have a structure in which fine through holes h1, h2 and h3 passing through the first lead frame 620 are formed on at least one of the connection parts 732, 734 and 736 of the first lead frame 620 shown in FIG. 32.

At least one of connection parts 732-1, 734-1 and 736-1 of the first lead frame 620-3 may include the fine through holes h1, h2 and h3 formed at a boundary part between a first upper surface part 712 and a first side surface part 714. Here, the diameter of the fine through holes h1, h2 and h3 may be smaller than the length D11 or D12 of through holes 722 and 724 in the first direction or the length D2 of the through hole 722 and 724 in the second direction. The number of the fine through holes h1 and h2 formed at the first connection part 732-1 and the second connection part 734-1 may be greater than the number of the fine through holes h3 formed at the third connection part 736-1, but the disclosure is not limited thereto. Further, the fine through holes h1, h2 and h3 may have a circular shape, an oval shape or a polygonal shape. The fine through holes h1, h2 and h3 may improve coupling force between the first lead frame 620-3 and the package body 610 as well as facilitate bending of the first lead frame 620-3.

Figure 38:
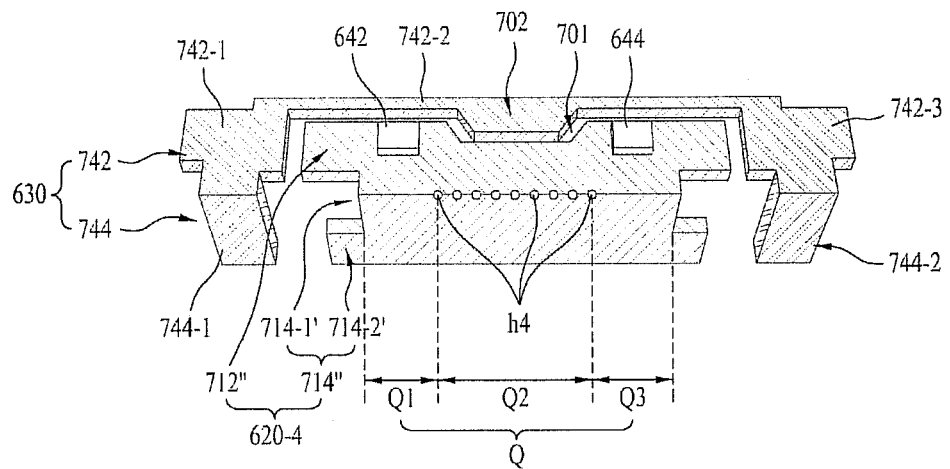

FIG. 38 illustrates a first lead frame 620-4 and a second lead frame 630 in accordance with another embodiment. Some parts in this embodiment which are substantially the same as those shown in FIG. 32 are denoted by the same reference numerals even though they are depicted in different drawings, and redundant description of parts in the above-mentioned description will be omitted or briefly given.

With reference to FIG. 38, the first lead frame 620-4 includes a first upper surface part 712" and a first side surface part 714". The first upper surface part 712" and the first side surface part 714" are modifications of the first upper surface part 712 and the first side surface part 714 shown in FIG. 32. That is, the first lead frame 620-4 has a structure in which the through holes 722 and 724 are omitted from the first upper surface part 712 and the first side surface part 714 of the first lead frame 620 shown in FIG. 32 and a plurality of fine through holes h4 separated from each other is formed at one region Q2 of a boundary part Q between the first upper surface part 721" and the first side surface part 714".

The boundary part Q between the first upper surface part 721" and the first side surface part 714" may be divided into a first boundary region Q1, a second boundary region Q2 and a third boundary region Q3. The first boundary region may correspond to or be aligned with the first light emitting chip 642, the third boundary region Q3 may correspond to or be aligned with the second light emitting chip 644, and the second boundary region Q2 may be located between the first boundary region Q1 and the third boundary region Q3.

The first boundary region Q1 and the third boundary region Q3 may serve as paths transmitting light generated from the first light emitting chip 642 and the second light emitting chip 644, and the plural fine through holes h4 may serve to facilitate bending between the first upper surface part 712" and the first side surface part 714". Although FIG. 38 illustrates the plural fine through holes h4 as having the same diameter and separation distance, the disclosure is not limited thereto. That is, in accordance with other embodiments, at least one of the plural fine through holes h4 may have a different diameter, or separation distances between the plural fine through holes h4 may be different.

Figure 39:
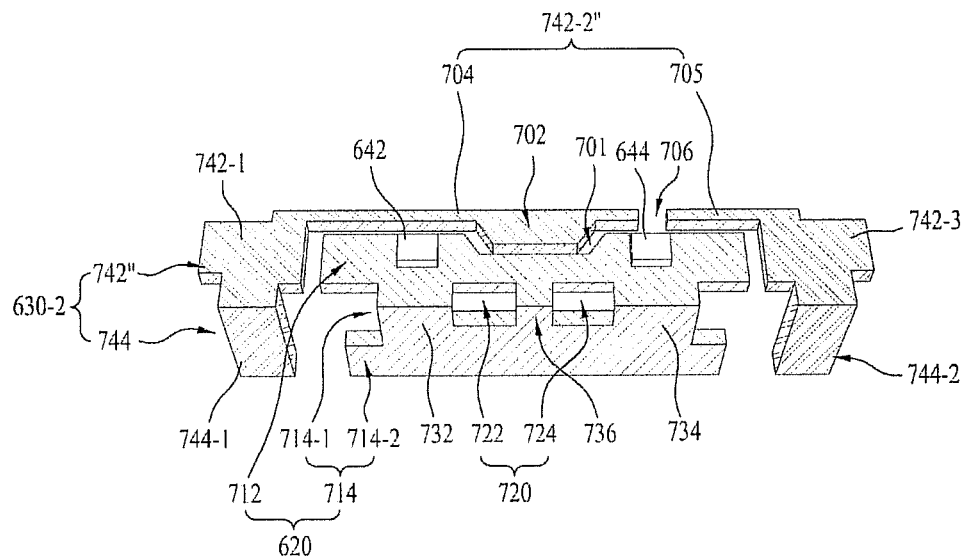

FIG. 39 illustrates a first lead frame 620 and a second lead frame 630-2 in accordance with another embodiment. The second lead frame 630-2 shown in FIG. 39 may be a modification of the second lead frame 630 shown in FIG. 32. Some parts in this embodiment which are substantially the same as those shown in FIG. 32 are denoted by the same reference numerals even though they are depicted in different drawings, and redundant description of parts in the above-mentioned description will be omitted or briefly given.

With reference to FIG. 39, differently from the second portion 742-2 of the second upper surface part 742 shown in FIG. 32, a second portion 742-2" of a second upper surface part 742" shown in FIG. 39 has a cut structure, and does not connect a first portion 742-1 and a third portion 742-3.

The second upper surface part 742" of the second lead frame 630-2 may include the first portion 742-1, the second portion 742-2" and the third portion 742-3. The first portion 742-1, the second portion 742-2" and the third portion 742-3 may be located around a corresponding one of side portions of the first upper surface part 712 of the first lead frame 620.

The second portion 742-2" of the second upper surface part 742" may include a first region 704 connected to the first portion 742-1 and a second region 705 connected to the third portion 742-3 and separated from the first region 704. Since a separation space 706 between the first region 704 and the second region 705 is filled with the package body 610, coupling force between the package body 610 and the second lead frame 630-2 may be improved. The second lead frame 630-2 shown in FIG. 39 may be divided into a first sub-frame 744-1, 742-2 and 704 and a second sub-frame 744-2, 742-3 and 705 which may be electrically isolated from each other.

Figure 40:
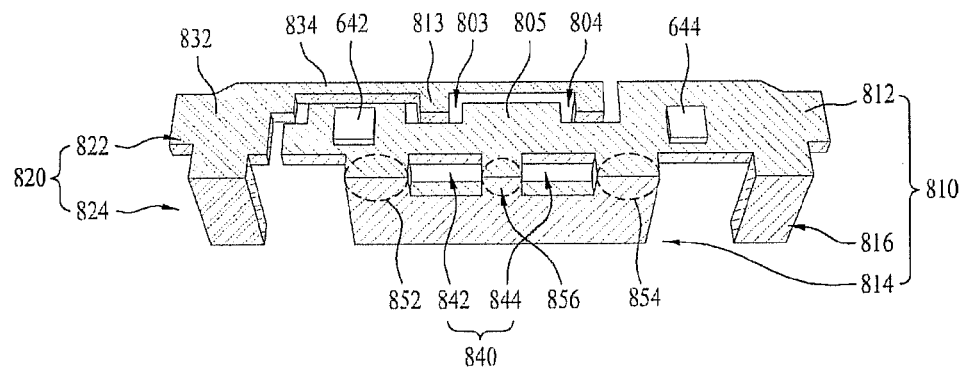

FIG. 40 illustrates a first lead frame 810 and a second lead frame 820 in accordance with another embodiment.

With reference to FIG. 40, the first lead frame 810 may include a first upper surface part 812, and a first side surface part 814 and a second side surface part 816 bent from a first side portion of the first upper surface part 812. Light emitting chips 642 and 644 may be disposed on the first upper surface part 812.

A second side portion of the first upper surface part 812 may include one or more first depressions 803 and 804 and a first protrusion 805. Here, the second side portion of the first upper surface part 812 may be opposite the first side portion of the first upper surface part 812. For example, the second side portion of the first upper surface part 812 may include two first depressions 803 and 804 and one first protrusion 805 located between the first depressions 803 and 804, but the disclosure is not limited thereto. The first depressions 803 and 804 may have a shape corresponding to second protrusions 813 and 814 provided on the second lead frame 820 which will be described later, and the first protrusion 805 may have a shape corresponding to a second depression 815 provided on the second lead frame 820. Although the first depressions 803 and 804 and the first protrusion 805 shown in FIG. 40 have a rectangular shape, the disclosure is not limited thereto and the first depressions 803 and 804 and the first protrusion 805 may have various shapes, such as a circular shape, a polygonal shape, an oval shape, etc. The light emitting chips 642 and 644 may be disposed on the first upper surface part 812 at both sides of the first depressions 803 and 804.

The first side surface part 814 may be connected to one region of the first side portion of the first side surface part 712, the second side surface part 816 may be connected to another region of the first side portion of the first side surface part 712, and the first side surface part 814 and the second side surface part 816 may be separated from each other. The first side surface part 814 and the second side surface part 816 may be exposed from one side surface of the package body 610.

The first lead frame 610 may include one or more through holes 840 formed on at least one of the first upper surface part 812 and the first side surface part 814. For example, the first lead frame 610 may include one or more through holes 840 formed adjacent to a boundary part between the first upper surface part 812 and the first side surface part 814. The through holes 840 may have the same structure and function as the through holes 720 shown in FIGS. 32 and 34.

The first lead frame 810 may include connection parts 852, 854 and 856 located adjacent to the boundary part between the first upper surface part 812 and the first side surface part 814, separated from each other by the through holes 840, and connecting the first upper surface part 812 and the first side surface part 814. The structure and function of the connection parts 852, 854 and 856 may be the same as those of the through holes 720 shown in FIGS. 32 and 34. The first lead frame 810 may include at least one connection part corresponding to or located adjacent to the light emitting chip 642 or 644.

The length of the connection parts (for example, 852 and 854) corresponding to or located adjacent to the light emitting chips 642 and 644 in the first direction may be greater than the length of the connection part (for example, 856) not corresponding to or not located adjacent to the light emitting chips 642 and 644 in the first direction.

In order to improve coupling with the package body 610 and air tightness to block moisture, the lower portion of the side surface of the second side surface part 816 may protrude in the sideward direction.

The second lead frame 820 may be disposed around at least side portion of the first lead frame 810. The second lead frame 820 may include a second upper surface pat 822 and a third side surface part 824. The second upper surface part 822 may be divided into a first portion 832 and a second portion 834 according to positions disposed around the first upper surface part 812.

The second portion 834 of the second upper surface part 822 may be opposite a second side portion of the first upper surface part 812. The first portion 832 of the second upper surface part 822 may be connected to one end of the second portion 834, and may correspond to or be opposite a third side portion of the first upper surface part 812. The third side portion may be vertical to the first side portion or the second side portion.

The second portion 834 of the second upper surface part 822 may include second protrusions 813 and 814 corresponding to the first depressions 803 and 804. The second protrusions 813 and 814 are areas for wire bonding with the first light emitting chip 642 and the second light emitting chip 644, and are located between the first light emitting chip 642 and the second light emitting chip 644, thus facilitating wire bonding with the first light emitting chip 642 and the second light emitting chip 644.

The third side surface part 824 may be bent downwardly from the second upper surface part 822 at a designated angle (for example, 90°). For example, the third side surface part 824 may be bent from one side portion of the first portion 832 of the second upper surface part 822. The second side surface part 816 and the third side surface part 824 may be symmetrical with respect to the first side surface part 814. In order to improve coupling with the package body 610 and air tightness to block moisture, the lower end portion of the side surface of the third side surface part 824 may protrude in the sideward direction. The first side surface part 814, the second side surface part 816 and the third side surface part 824 may be exposed to the same side surface of the package body 610.

Figure 41:
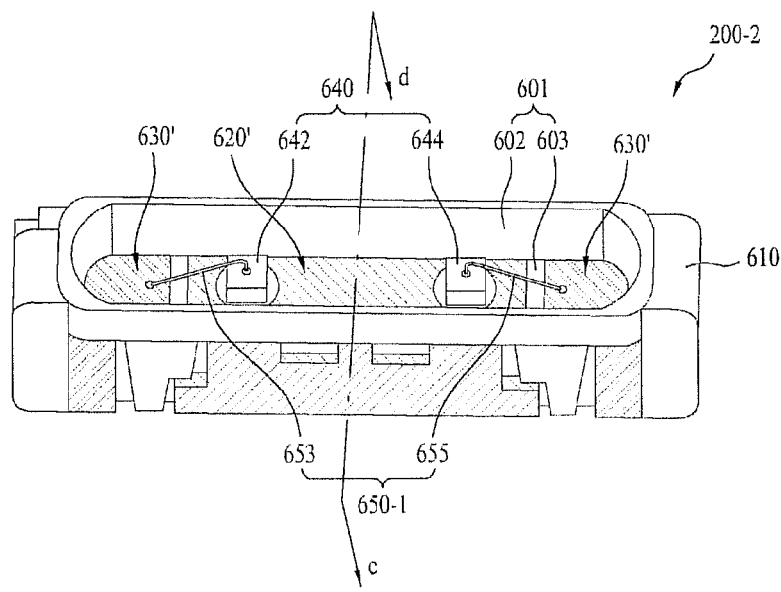
FIG. 41 is a perspective view of a light emitting device package in accordance with another embodiment.
Figure 42:
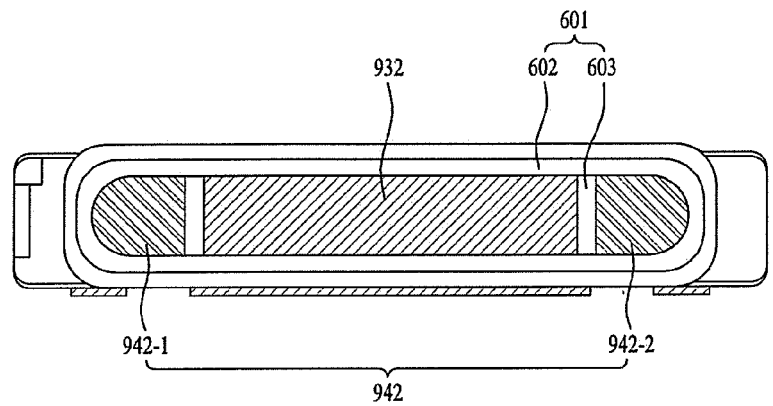
FIG. 42 is a top view of the light emitting device package shown in FIG. 41.
Figure 43:
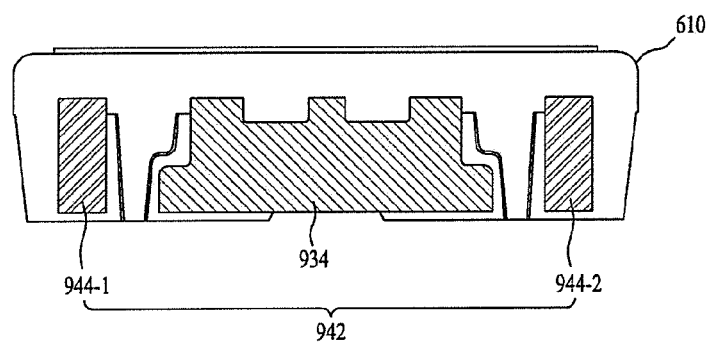
FIG. 43 is a front view of the light emitting device package shown in FIG. 41.
Figure 44:
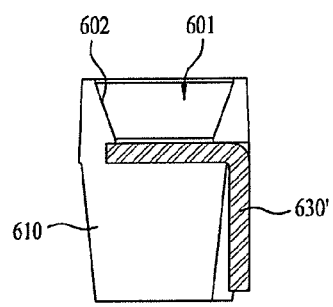
FIG. 44 is a cross-sectional view of the light emitting device package shown in FIG. 41, taken along the line c-d.
Figure 45:
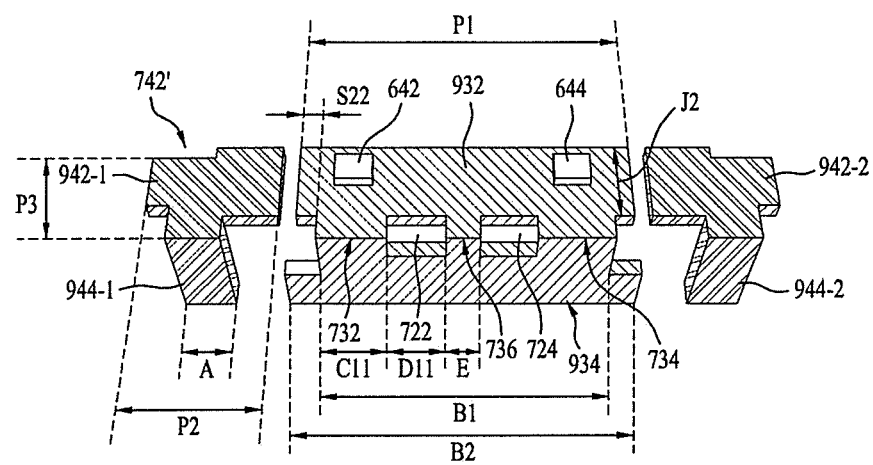
FIG. 45 is a perspective view illustrating a first lead frame and a second lead frame shown in FIG. 41.

FIG. 41 is a perspective view of a light emitting device package 200-2 in accordance with another embodiment, FIG. 42 is a top view of the light emitting device package 200-2 shown in FIG. 41, FIG. 43 is a front view of the light emitting device package 200-2 shown in FIG. 41, FIG. 44 is a cross-sectional view of the light emitting device package 200-2 shown in FIG. 41, taken along the line c-d, and FIG. 45 is a perspective view illustrating a first lead frame 620' and a second lead frame 630' shown in FIG. 41. Some parts in this embodiment which are substantially the same as those shown in FIGS. 28 to 32 are denoted by the same reference numerals even though they are depicted in different drawings, and redundant description of parts in the above-mentioned description will be omitted or briefly given.

With reference to FIGS. 41 to 45, the first lead frame 620' of the light emitting device package 200-2 may include a first upper surface part 932 and a first side surface part 934. Differently from the first upper surface part 712 shown in FIG. 32, the first upper surface part 932 shown in FIG. 45 does not include a depression. Further, a second upper surface 942 of the second lead frame 630' may have a similar structure to the structure in which the second portion 742-2 of the second upper surface part 742 shown in FIG. 32 is omitted.

The first side surface part 934 may have the same structure as the first side surface part 714 shown in FIG. 32. The length P1 of the first upper surface part 932 in the first direction may be smaller than the length of the first upper surface part 712 shown in FIG. 32, and the length J2 of the first upper surface part 932 in the second direction may be greater than the length J1 of the first upper surface part 712. For example, the length P1 of the first upper surface part 932 in the first direction may be 4.8 mm~4.9 mm and the length J2 of the first upper surface part 932 in the second direction may be 0.67 mm~0.77 mm Therefore, since the area of the first upper surface part 932 shown in FIG. 41 is greater than the area of the first upper surface part 712 shown in FIG. 32, the light emitting device package 200-2 in accordance with the embodiment of FIG. 41 may mount light emitting chips having a larger size. The sizes of the first side surface part 944, through holes 722 and 724 and connection parts may be equal to those shown in FIG. 33.

The second lead frame 630' may include the second upper surface part 942 and a second side surface part 944. The second upper surface part 942 may include a first portion 942-1 disposed around a third side portion of the first upper surface part 932 and a second portion 942-2 disposed around a fourth side portion of the first upper surface part 932. The third side portion of the first upper surface part 932 may be a side portion vertical to a first side portion of the first upper surface part 932, or the fourth side portion of the first upper surface part 932 may be a side portion opposite the third side portion of the first upper surface part 932.

The first portion 942-1 and the second portion 942-2 of the second upper surface part 942 may be separated from each other, and may be electrically isolated from each other.

The second side surface part 944 may include a first portion 944-1 connected to the first portion 942-1 of the second upper surface part 942, and a second portion 944-2 connected to the second portion 942-2 of the second upper surface part 942. However, the length P2 of the first portion 942-1 and the second portion 942-2 of the second upper surface part 942 in the first direction may be greater than the length H2 of the first portion 742-1 and the third portion 742-3 of the second upper surface part 742 shown in FIG. 32 in the first direction.

For example, the length P2 of the first portion 942-1 and the second portion 942-2 of the second upper surface part 942 in the first direction may be 1.04 mm~14 mm and the length P2 of the first portion 942-1 and the second portion 942-2 of the second upper surface part 942 in the second direction may be 0.45 mm~0.55 mm The length S22 of protrusions of the first upper surface part 932 protruding to support the first lead frame 620' of a lead frame array in the first direction may be 0.14 mm~0.24 mm A first light emitting chip 642 may be electrically connected to the first portion 942-1 of the second upper surface part 942 by a first wire 653, and a second light emitting chip 644 may be electrically connected to the second portion 942-2 of the second upper surface part 942 by a second wire 655.

The first light emitting chip 642 and the second light emitting chip 644 may emit light of the same wavelength. For example, the first light emitting chip 642 and the second light emitting chip 644 may be red light emitting chips emitting red light.

Further, the first light emitting chip 642 and the second light emitting chip 644 may emit light of different wavelengths. For example, the first light emitting chip 642 may be a red light emitting chip, the second light emitting chip 644 may be a yellow light emitting chip, and the first light emitting chip 642 and the second light emitting chip 644 mounted on the light emitting device package 200-2 in accordance with this embodiment may be individually operated.

First power (for example, negative (−) power) may be supplied to the first lead frame 620', and second power for example, positive (+) power) may be supplied to the second lead frame 630'. Since the second lead frame 630' is divided into two portions (942-1, 944-1, and 942-2, 944-2) electrically isolated from each other, the first lead frame 620' is used as a common electrode and second power is individually supplied to the first portion 942-1 and the second portion 942-2 of the second upper surface part 942 of the second lead frame 630', thereby individually operating the first light emitting chip 642 and the second light emitting chip 644.

Therefore, if the light emitting device package 200-2 shown in FIG. 41 is mounted on the light source modules 100-1 to 100-21 in accordance with the above-described embodiments, the light source modules 100-1 to 100-21 may generate surface light of various colors. For example, if only the first light emitting chip 642 is operated, the light source modules 100-1 to 100-21 in accordance with the above-described embodiments may generate red surface light, and if only the second light emitting chip 644 is operated, the light source modules 100-1 to 100-21 in accordance with the above-described embodiments may generate yellow surface light.

Figure 46:
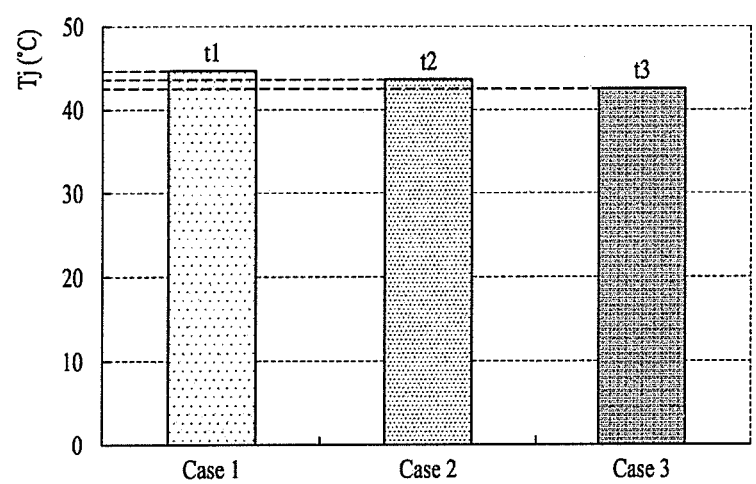
FIG. 46 is a graph illustrating measured temperatures of light emitting device packages in accordance with embodiments.

FIG. 46 is a graph illustrating measured temperatures of light emitting device packages 200-1 and 200-2 in accordance with the embodiments. The measured temperatures shown in FIG. 46 represent temperatures of the light emitting chips when the light emitting device packages 200-1 and 200-2 emit light.

Case 1 represents the measured temperature of the light emitting chips if the length of a first portion and a second portion of a first lead frame in the first direction is equal to the length of a third portion, case 2 represents the measured temperature of the light emitting chips shown in FIG. 26, and case 3 represents the measured temperature of the light emitting chips shown in FIG. 39.

With reference to FIG. 46, the measured temperature t1 of case 1 is 44.54☐, the measured temperature t2 of case 2 is 43.66☐, and the measured temperature t3 of case 3 is 43.58☐.

Therefore, since the light source modules in accordance with the embodiments have improved heat dissipation effects by changing designs of the connection parts 732, 734 and 736 of the first side surface part 714 of the first lead frame 620, rise of the temperature of the light emitting chips 640 mounted on the light emitting device packages 200-1 and 200-2 may be suppressed when the light emitting device packages 200-1 and 200-2 emit light, thereby preventing brightness reduction and generation of wavelength shift.

Figure 47:
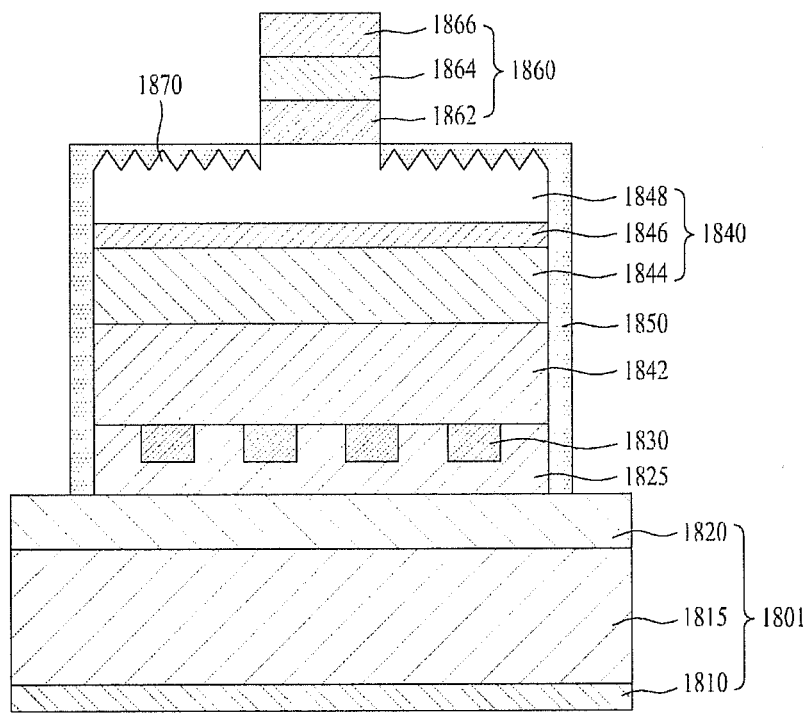
FIG. 47 is a cross-sectional view of a light emitting chip shown in FIG. 28 in accordance with one embodiment.

FIG. 47 is a cross-sectional view of a light emitting chip shown 640 in FIG. 28 in accordance with one embodiment. The light emitting chip 640 shown in FIG. 47 may be a vertical type chip which emits red light having a wavelength range of, for example, 600 nm~690 nm With reference to FIG. 47, the light emitting chip 640 includes a second electrode layer 1801, a reflective layer 1825, a light emitting structure 1840, a passivation layer 1850, and a first electrode layer 1860.

The second electrode layer 1801 together with the first electrode layer 1860 provides power to the light emitting structure 1840. The second electrode layer 1801 may include an electrode material layer 1810 to inject current, a support layer 1815 located on the electrode material layer 1810, and a bonding layer 1820 located on the support layer 1815. The second electrode layer 1801 may be bonded to the first lead frame 620, for example, the first upper surface part 712, of the light emitting device package 200-1 shown in FIG. 32.

The electrode material layer 1810 may be formed of Ti/Au, and the support layer 1815 may be formed of metal or a semiconductor material. Further, the support layer 1815 may be formed of a material having high electrical conductivity and high thermal conductivity. For example, the support layer 1815 may be formed of metal including at least one of copper (Cu), a copper alloy, gold (Au), nickel (Ni), molybdenum (Mo) and copper-tungsten (Cu—W), or a semiconductor including at least one of Si, Ge, GaAs, ZnO and SiC.

The bonding layer 1820 is disposed between the support layer 1815 and the reflective layer 1835, and serves to bond the support layer 1815 to the reflective layer 1825. The bonding layer 1820 may include a bonding metal material, for example, at least one of In, Sn, Ag, Nb, Pd, Ni, Au and Cu. Since the bonding layer 1820 is formed to bond the support layer 1815 to the reflective layer 1825, the bonding layer 1820 may be omitted if the support layer 1815 is formed by plating or deposition.

The reflective layer 1825 is disposed on the bonding layer 1820. The reflective layer 1825 may reflect light incident from the light emitting structure 1840, thus improving light extraction efficiency. The reflective layer 1825 may be formed of a reflective metal material, for example, metal including at least one of Ag, Ni, Al, Rh, Pd, Ir, Ru, Mg, Zn, Pt, Au and Hf, or an alloy thereof.

Further, the reflective layer 1825 may be formed in a single layered structure or a multi-layered structure using conductive oxide layers, for example, indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO) and antimony tin oxide (ATO). Further, the reflective layer 1825 may be formed in a multi-layered structure including metal and conductive oxides, such as IZO/Ni, AZO/Ag, IZO/Ag/Ni and AZO/Ag/Ni.

An Ohmic region 1830 may be located between the reflective layer 1825 and the light emitting structure 1840. The Ohmic region 1830 is a region which is in Ohmic contact with the light emitting structure 1840, and serves to effectively supply power to the light emitting structure 1840.

The Ohmic region 1830 may be formed through Ohmic contact between the light emitting structure 1840 and an Ohmic contact material, for example, a material including at least one of Be, Au, Ag, Ni, Cr, Ti, Pd, Ir, Sn, Ru, Pt and Hf. For example, the material forming the Ohmic region 1830 may include AuBe, and may be provided in a dot shape.

The light emitting structure 1840 may include a window layer 1842, a second semiconductor layer 1844, an active layer 1846 and a first semiconductor layer 1848. The window layer 1842 may be a semiconductor layer disposed on the reflective layer 1825, and may be formed of GaP.

The second semiconductor layer 1844 is disposed on the window layer 1842. The second semiconductor layer 1844 may be formed of a group 3-5 or group 2-6 compound semiconductor, and may be doped with a second conductivity-type dopant. For example, the second semiconductor layer 1844 may be formed of one of AlGaInP, GaInP, GaN, AlN, AlGaN, InGaN, InN, InAlGaN, AlInN, AlGaAs, GaP, GaAs and GaAsP, and may be doped with a P-type dopant (for example, Mg, Zn, Ca, Sr or Ba).

The active layer 1846 may be disposed between the second semiconductor layer 1844 and the first semiconductor layer 1848, and may generate light using energy generated during recombination of electrons and holes provided from the second semiconductor layer 1844 and the first semiconductor layer 1848.

The active layer 1846 may be formed of a group 3-5 or group 2-6 compound semiconductor, and may be formed in a single quantum well structure, a multi-quantum well structure, a quantum wire structure or a quantum dot structure.

For example, the active layer 1846 may be formed in a single quantum or multi-quantum well structure including well layers and barrier layers. The well layers may be formed of a material having a lower energy band gap than the barrier layers. For example, the active layer 1846 may be formed of AlGaInP or GaInP.

The first semiconductor layer 1848 may be formed of a compound semiconductor. The first semiconductor layer 1848 may be formed of a group 3-5 or group 2-6 compound semiconductor, and may be doped with a first conductivity-type dopant. For example, the first semiconductor layer 1848 may be formed of one of AlGaInP, GaInP, GaN, AlN, AlGaN, InGaN, InN, InAlGaN, AlInN, AlGaAs, GaP, GaAs and GaAsP, and may be doped with an N-type dopant (for example, Si, Ge or Sn).

The light emitting structure 1840 may emit red light having a wavelength range of 600 nm~690 nm and the first semiconductor layer 1848, the active layer 1846 and the second semiconductor layer 1844 may have compositions which may emit red light. In order to increase light extraction efficiency, a roughness 1870 may be formed on the upper surface of the first semiconductor layer 1848.

The passivation layer 1850 is disposed on the side surface of the light emitting structure 1840. The passivation layer 1850 serves to electrically protect the light emitting structure 1840. The passivation layer 1850 may be formed of an insulating material, for example, $SiO_2$, SiOx, SiOxNy or $Al_2O_3$. The passivation layer 1850 may be disposed on at least portion of the upper surface of the first semiconductor layer 1848.

The first electrode layer 1860 may be disposed on the first semiconductor layer 1848, and may have a designated pattern. The first electrode layer 1860 may be formed in a single layered structure or a multi-layered structure. For example, the first electrode layer 1860 may include a first layer 1862, a second layer 1864 and a third layer 1866 which are sequentially stacked. The first layer 1862 may be in Ohmic contact with the first semiconductor layer 1848, and may be formed of GaAs. The second layer 1864 may be formed of an AuGe/Ni/Au alloy. The third layer 1866 may be formed of a Ti/Au alloy.

As shown in FIGS. 28 and 41, the first electrode layer 1860 may be electrically bonded to the second lead frame 630 or 630' by the wire 652, 653, 654 or 655.

In general, when the temperature of the light emitting chip rises, wavelength shift is generated and brightness is reduced. As compared to a blue LED emitting blue light and amber LED emitting yellow light, a red LED emitting red light more severely generate wavelength shift and reduce brightness according to temperature rise. Therefore, in a light emitting device package and a light source module using red light emitting chips, it is important to take measures to dissipate heat to suppress rise of the temperature of the light emitting chips.

The light source modules 100-1 to 100-21 and the light emitting device packages 200-1 and 200-2 included in the light emitting lamp 1 in accordance with the embodiment may improve light dissipation efficiency, as described above, and may thus suppress rise of the temperature of light emitting chips even if red light emitting chips are used, thereby suppressing wavelength shift and brightness reduction.

Figure 48:
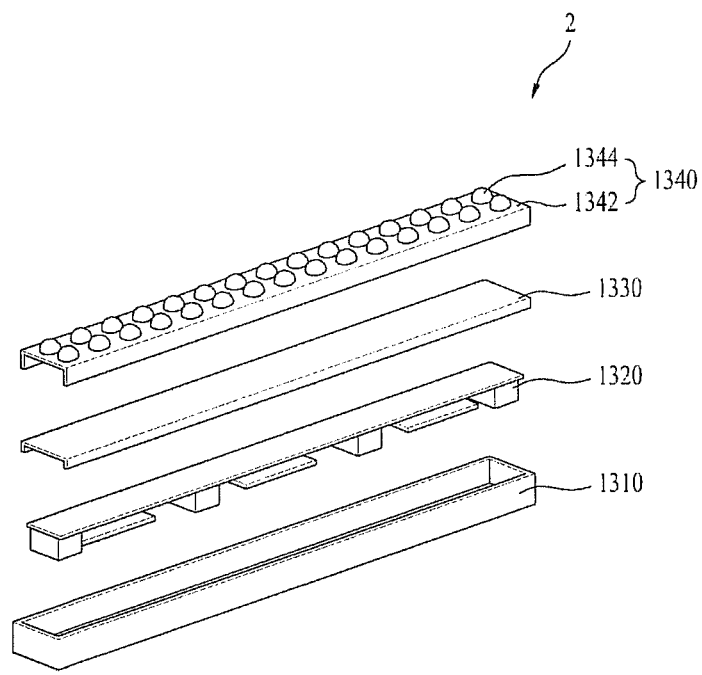
FIG. 48 is an exploded perspective view of a light emitting lamp in accordance with another embodiment.

FIG. 48 is an exploded perspective view of a light emitting lamp 2 in accordance with another embodiment. With reference to FIG. 48, the light emitting lamp 2 includes a housing 1310, a light source module 1320, a diffusion plate 1330, and a micro-lens array 1340.

The housing 1310 may accommodate the light source module 1320, the diffusion plate 1330 and the micro-lens array 1340, and may be formed of a light transmitting material.

The light source module 1320 may be one of the light source modules 100-1 to 100-21 in accordance with the above-described embodiments. Further, the light source module 1320 may be one of the light source modules 100-1 to 100-3, 100-7 and 100-8, 100-12 and 100-13, and 100-20 excluding the diffusion plate 70 from among the light source modules 100-1 to 100-21 in accordance with the above-described embodiments. Further, the light source module 1320 may have a structure in which the diffusion plate 70 is omitted from the light source modules 100-4 to 100-6, 100-9 to 100-11, and 100-14 to 100-21.

The diffusion plate 1330 may serve to uniformly diffuse light having passed through the light source module 1320 throughout the overall surface. The diffusion plate 1330 may be formed of the same material as the diffusion plate 70, but the disclosure is not limited thereto. In accordance with another embodiment, the diffusion plate 1330 may be omitted.

The micro-lens array 1340 may have a structure in which a plurality of micro-lenses 1344 is disposed on a base film 1342. The respective micro-lenses 1344 may be separated from each other by a predetermined interval. The base film 1342 between the respective micro-lenses 1344 may be flat, and the respective micro-lenses 1344 may be separated from each other by a pitch of 50~500 μm Although FIG. 48 illustrates the diffusion plate 1330 and the micro-lens array 1340 as being separately provided, another embodiment may describe the diffusion plate 1330 and the micro-lens array 1340 as being integrated.

Figure 50:
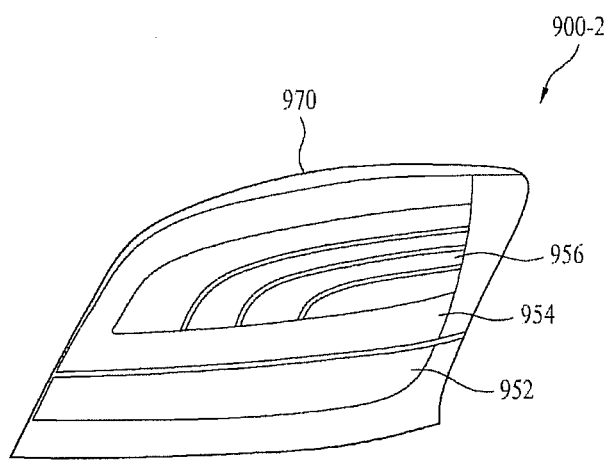
FIG. 50 is a perspective view illustrating a tail lamp for vehicles in accordance with one embodiment.
Figure 51:
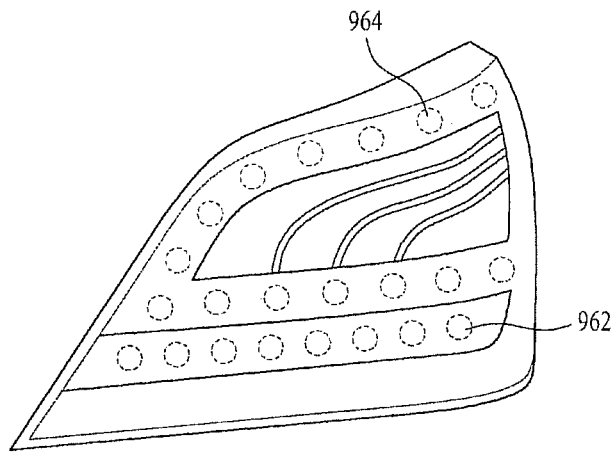
FIG. 51 is a perspective view illustrating a general tail lamp for vehicles.

FIG. 50 illustrates a tail lamp 900-2 for vehicles in accordance with one embodiment, and FIG. 51 illustrates a general tail lamp for vehicles.

With reference to FIG. 50, the tail lamp 900-2 for vehicles may include a first light source module 952, a second light source module 954, a third light source module 956 and a housing 970.

The first light source module 952 may be a light source serving as a direction indicator lamp, the second light source module 954 may be a light source serving as a vehicle side lamp, the third light source module 956 may be a light source serving as a stop lamp, but the disclosure is not limited thereto and the functions thereof may be exchanged.

The housing 970 accommodates the first to third light source modules 952, 954 and 956, and may be formed of a light transmitting material. The housing 970 may be bent according to the design of a vehicle body. At least one of the first to third light source modules 952, 954 and 956 may be one of the light source modules 100-1 to 100-21 in accordance with the above-described embodiments.

In the case of a tail lamp, a driver may view the front at a long distance only if the light intensity during stoppage of a vehicle is more than 110 cd, and the tail lamp generally requires the light intensity more than such an intensity by 30%. Further, in order to output light of the intensity more than such an intensity by 30%, the number of light emitting device packages applied to the light source module 952, 954 or 956 needs to be increased by 25%~35%, or output of the respective light emitting device packages needs to be increased by 25%~35%.

If the number of the light emitting device packages is increased, it may be difficult to manufacture the light source module due to restriction of a disposition space. Therefore, a desired intensity (for example, 110 cd or more) of light may be obtained with a small number of the light emitting device packages by increasing output of the respective light emitting device packages mounted on the light source module. In general, since a value obtained by multiplying the output W of each of light emitting device packages and the number N of the light emitting device packages becomes the overall output of the light source module, the proper output and number of the light emitting device packages according to the area of the light source module may be set in order to obtain a desired light intensity.

For example, in the case of light emitting device packages having power consumption of 0.2 Watts and output of 13 lm, 37~42 light emitting device packages may be disposed in a designated area to generate a light intensity of about 100 cd. However, in the case of light emitting device packages having power consumption of 0.5 Watts and output of 30 lm, only 13~15 light emitting device packages may be disposed in the same area to generate a similar light intensity. The number of light emitting device packages to be disposed on a light source module having a designated area in order to obtain a designated output may be determined by an arrangement pitch, a content of a light diffusion material within a light guide layer and a pattern shape of a reflective layer. Here, the pitch may be a distance from the central point of one of two neighboring light emitting device packages to the central point of the other one of the two neighboring light emitting device packages.

When light emitting device packages are disposed in the light source module, the light emitting device packages are separated from each other by a designated interval. Here, in the case of high output light emitting device packages, the number of the light emitting device packages to be disposed may be relatively reduced and the light emitting device packages may be disposed by a large interval therebetween, and thus a space may be effectively used. Further, if high output light emitting device packages are disposed by a small interval therebetween, a higher light intensity may be obtained as compared to arrangement of high output light emitting device packages by a large interval therebetween.

Figure 52A:
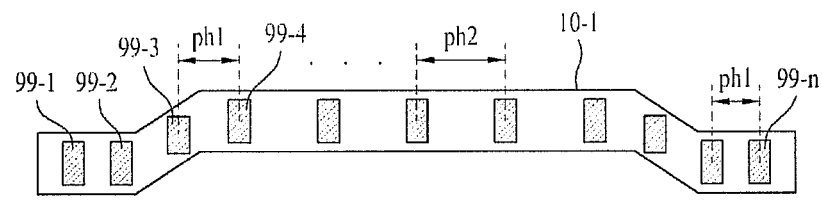
FIGS. 52A and 52B are views illustrating intervals between light emitting device packages of light source modules used in tail lamps for vehicles in accordance with embodiments.
Figure 52B:
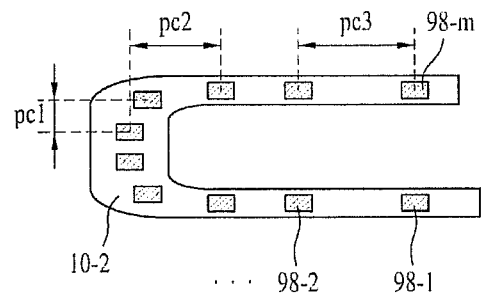

FIGS. 52A and 52B illustrate intervals between light emitting device packages of light source modules used in tail lamps for vehicles in accordance with embodiments. For example, FIG. 52A may illustrate the first light source module 952 shown in FIG. 50, and FIG. 52B may illustrate the second light source module 954 shown in FIG. 50.

With reference to FIGS. 52A and 52B, light emitting device packages 99-1 to 99-$n$ ($n$ being a natural number>1) or 98-1 to 98-$m$ ($m$ being a natural number>1) separated from each other may be disposed on a substrate 10-1 or 10-2.

Intervals (for example, ph1, ph2 and ph3, or pc1, pc2 and pc3) between two neighboring light emitting device packages may be different, and may be in the range of 8~30 mm The reason for this is that if the arrangement intervals (for example, ph1, ph2 and ph3, or pc1, pc2 and pc3) are less than 8 mm although the arrangement intervals may be changed according to consumption power of the light emitting device packages 99-1 to 99-$n$ or 98-1 to 98-$m$, interference of light from the neighboring light emitting device packages (for example, 99-3 or 99-4) occurs and a visible light region may be generated. Further, if the arrangement intervals (for example, ph1, ph2 and ph3, or pct, pc2 and pc3) are more than 30 mm a dark region may be generated due to an area which light does not reach.

As described above, since the light source modules 100-1 to 100-21 have flexibility and may be easily mounted on the bent housing 970, the tail lamp 900-2 for vehicles in accordance with the embodiment may improve a degree of freedom in design.

Further, since the light source modules 100-1 to 100-21 have a structure with improved heat dissipation efficiency, the tail lamp 900-2 for vehicles in accordance with the embodiment may prevent generation of wavelength shift and brightness reduction.

The general tail lamp for vehicles shown in FIG. 51 is a point light source and may thus generate partial spots 962 and 964 on a light emission surface during emission of light, but the tail lamp 900-2 for vehicles in accordance with the embodiment is a surface light source and may thus achieve uniform brightness and luminous intensity throughout a light emission surface.

As is apparent from the above description, a light emitting lamp in accordance with one embodiment may achieve a thin profile, improve a degree of freedom in product design and heat dissipation efficiency, and suppress wavelength shift and brightness reduction.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting lamp comprising:
a light source module including at least one light source disposed on a substrate and a light guide layer disposed on the substrate burying the at least one light source; and
a housing accommodating the light source module,
wherein the at least one light source includes:
a body having a cavity;
a first lead frame including a first end exposed to the cavity and a second end passing through the body and exposed to a first surface of the body;
a second lead frame including a first end exposed to one portion of the first surface of the body, a second end exposed to another portion of the first surface of the body, and a third end exposed to the cavity; and
at least one light emitting chip including a first semiconductor layer, an active layer and a second semiconductor layer, and disposed on the first lead frame, and
wherein the second end of the first lead frame is positioned directly between the first and second ends of the second lead frame, and the third end of the second lead frame connects the first end of the second lead frame to the second end of the second lead frame.

2. The light emitting lamp according to claim 1, wherein the first lead frame includes:
a first upper surface part which is exposed to the cavity and on which the at least one light emitting chip is disposed; and
a first side surface part bent from a first side portion of the first upper surface part and exposed to the first surface of the body.

3. The light emitting lamp according to claim 2, wherein the first lead frame further includes at least one through hole formed adjacent to a boundary part between the first upper surface part and the first side surface part.

4. The light emitting lamp according to claim 3, wherein the first lead frame further includes connection parts connecting the first upper surface part and the first side surface part, and the at least one through hole is located between the connection parts.

5. The light emitting lamp according to claim 4, wherein a length in a first direction of a first connection part aligned with the at least one light emitting chip from among the connection parts is greater than a length in the first direction of a second connection part not aligned with the at least one light emitting chip, and the first direction is the X-axis direction in an XYZ coordinate system.

6. The light emitting lamp according to claim 3, wherein the second lead frame includes:
a second upper surface part disposed around at least one side portion of the first upper surface part and exposed to the cavity of the body; and
a second side surface part bent from the second upper surface part and exposed respectively to the one portion and the another portion of the first surface of the body.

7. The light emitting lamp according to claim 2, wherein the second lead frame includes:
a second upper surface part disposed around at least one side portion of the first upper surface part and exposed to the cavity of the body; and
a second side surface part bent from the second upper surface part and exposed respectively to the one portion and the another portion of the first surface of the body.

8. The light emitting lamp according to claim 7, wherein the second upper surface part of the second lead frame includes a first portion, a second portion, and a third portion,
wherein the second portion of the second lead frame is opposite a second side portion of the first upper surface part of the first lead frame, and
wherein the first portion of the second lead frame is connected to one end of the second portion, and the third portion of the second lead frame is connected to the other end of the second portion of the second lead frame.

9. The light emitting lamp according to claim 7, wherein the second side surface part of the second lead frame includes:
a first portion bent from one side portion of the first portion of the second side surface part; and
a second portion bent from one side portion of the second portion of the second side surface part.

10. The light emitting lamp according to claim 1, wherein the light source module further includes a heat dissipation member disposed on the lower surface of the substrate.

11. The light emitting lamp according to claim 1, wherein the at least one light source is a side view type light emitting device package.

12. The light emitting lamp according to claim 1, wherein the substrate includes at least one via hole.

13. The light emitting lamp according to claim 1, wherein the light source module is a surface light source.

14. The light emitting lamp according to claim 1, wherein the light source module further includes a reflective sheet disposed between the substrate and the light guide layer.

15. The light emitting lamp according to claim 14, wherein the light source module further includes reflective patterns disposed on the reflective sheet.

16. The light emitting lamp according to claim 15, wherein the light source module further includes a first optical sheet disposed on the light guide layer and dispersing light emitted from the light guide layer.

17. The light emitting lamp according to claim 16, wherein the light source module further includes optical patterns disposed on the first optical sheet and blocking or reflecting light emitted from the at least one light source.

18. The light emitting lamp according to claim 17, wherein the light source module further includes a second optical sheet disposed on the first optical sheet and the optical patterns.

19. The light emitting lamp according to claim 18, wherein the light source module further includes a diffusion plate disposed on the second optical sheet.

20. The light emitting lamp according to claim 19, further comprising a plurality of lenses disposed on the diffusion plate.

21. The light emitting lamp according to claim 1, wherein the light guide layer is formed of a UV curable resin including an oligomer.

22. The light emitting lamp according to claim 21, wherein the UV curable resin includes at least one selected from among the group consisting of urethane acrylate, epoxy acrylate, polyester acrylate, polyether acrylate, polybutadiene acrylate and silicon acrylate.

23. The light emitting lamp according to claim 1, wherein the light guide layer is formed of a thermosetting resin including at least one selected from among the group consisting of a polyester polyol resin, an acryl polyol resin, a hydrocarbon-based solvent and/or an ester-based solvent.

24. The light emitting lamp according to claim 1, wherein the light guide layer includes a diffusion material diffusing light including at least one selected from the group consisting of silicon, silica, glass bubbles, PMMA, urethane, Zn, Zr, $Al_2O_3$ and acryl.

25. The light emitting lamp according to claim 1, wherein the light source module further includes at least one connector disposed on the substrate to be electrically connected to the outside.

26. The light emitting lamp according to claim 25, wherein the substrate includes a coupling fixing part to be coupled with the outside.

27. The light emitting lamp according to claim 1, wherein the substrate includes a circuit pattern and an insulating layer, and has flexibility.

28. The light emitting lamp according to claim 1, wherein the at least one light emitting chip emits red light having a wavelength range of 600 nm~690 nm.

29. A light emitting lamp comprising:
a light source module including at least one light source disposed on a substrate and a light guide layer disposed on the substrate to surround the at least one light source; and
a housing for the light source module,
wherein the at least one light source includes:
a body having a cavity;
a first lead frame having a first surface and a second surface;
a second lead frame having a first surface, a second surface and a third surface which are physically connected to each other; and
at least one light emitting chip disposed on the first surface of the first lead frame,
wherein the first surface of the first lead frame and the first surface of the second lead frame is positioned on a surface in the cavity and the second surface of the first lead frame and the second surface of the second lead frame are positioned outside the cavity, and
wherein the first surface of the first lead frame is positioned adjacent to the first surface of the second lead frame, and the second surface of the first lead frame is positioned adjacent to the second and third surfaces of the second lead frame, and the second surface of the first lead frame is positioned directly between the second and third surfaces of the second lead frame, and the first surface of the second lead frame connects the second surface of the second lead frame to the third surface of the second lead frame.

30. The light emitting lamp of claim 29, wherein the second and third surfaces of the second lead frame are positioned coplanar to the second surface of the first lead frame.

31. The light emitting lamp of claim 29, wherein the first surfaces of the first and second lead frames are positioned coplanar to each other.

32. The light emitting lamp according to claim 29, wherein the second surface of the first lead frame is bent from a first side portion of the first surface of the first lead frame, and
wherein the first surface of the second lead frame is disposed to surround remaining side portions except for the first side portion of the first surface of the first lead frame.

33. A light emitting lamp comprising:
a light source module including at least one light source disposed on a substrate and a light guide layer disposed on the substrate to surround the at least one light source; and
a housing for the light source module,
wherein the at least one light source includes:
a body having a cavity;
a first lead frame having a first surface and a second surface;
a second lead frame having a first surface, a second surface and a third surface; and
at least one light emitting chip disposed on the first surface of the first lead frame,
wherein the first surface of the first lead frame and the first surface of the second lead frame are positioned on a surface in the cavity and the second surface of the first lead frame and the second and third surfaces of the second lead frame are positioned outside the cavity,
wherein the first surface of the first lead frame is positioned adjacent to the first surface of the second lead frame inside the cavity, along a length of the second lead frame inside the cavity, and
wherein the second surface of the first lead frame is positioned directly between the second and third surfaces of the second lead frame, and the first surface of the second lead frame connects the second surface of the second lead frame to the third surface of the second lead frame.

* * * * *